United States Patent
Lin et al.

(10) Patent No.: US 11,437,344 B2
(45) Date of Patent: Sep. 6, 2022

(54) WAFER BONDING METHOD

(71) Applicant: Taiwan Semiconductor Manufacturing Co., Ltd., Hsinchu (TW)

(72) Inventors: Yung-Chi Lin, Su-Lin (TW); Tsang-Jiuh Wu, Hsinchu (TW); Wen-Chih Chiou, Zhunan Township (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 77 days.

(21) Appl. No.: 17/019,913

(22) Filed: Sep. 14, 2020

(65) Prior Publication Data

US 2021/0305200 A1 Sep. 30, 2021

Related U.S. Application Data

(60) Provisional application No. 63/001,163, filed on Mar. 27, 2020.

(51) Int. Cl.
*H01L 25/065* (2006.01)
*H01L 23/00* (2006.01)
(Continued)

(52) U.S. Cl.
CPC ............ *H01L 24/80* (2013.01); *B23K 26/362* (2013.01); *H01L 21/32136* (2013.01); *H01L 24/03* (2013.01); *H01L 24/08* (2013.01); *H01L 25/0657* (2013.01); *H01L 25/50* (2013.01); *H01L 2224/08146* (2013.01);
(Continued)

(58) Field of Classification Search
CPC ........... H01L 21/2007; H01L 21/02087; H01L 27/14687; H01L 27/14632; H01L 33/0093; H01L 24/80; H01L 24/08; H01L 25/0657; H01L 2224/08146; H01L 2224/80201; H01L 2224/80895; H01L 2224/80896; H01L 25/50; H01L 21/32136; H01L 24/03; H01L 2224/94; H01L 2225/06541; H01L 23/522; H01L 24/05; H01L 2224/80001; B23K 26/362
See application file for complete search history.

(56) References Cited

U.S. PATENT DOCUMENTS

2012/0164778 A1* 6/2012 Blanchard ......... H01L 21/76254
438/459
2014/0024170 A1 1/2014 Kuo et al.
(Continued)

FOREIGN PATENT DOCUMENTS

KR 20180053802 A 5/2018
TW 202006871 A 2/2020
WO 2017052658 A1 3/2017

*Primary Examiner* — Thanh Y. Tran
(74) *Attorney, Agent, or Firm* — Slater Matsil, LLP

(57) ABSTRACT

In an embodiment, a device includes: a first wafer including a first substrate and a first interconnect structure, a sidewall of the first interconnect structure forming an obtuse angle with a sidewall of the first substrate; and a second wafer bonded to the first wafer, the second wafer including a second substrate and a second interconnect structure, the sidewall of the first substrate being laterally offset from a sidewall of the second substrate and a sidewall of the second interconnect structure.

20 Claims, 25 Drawing Sheets

(51) Int. Cl.
  *H01L 21/3213* (2006.01)
  *H01L 25/00* (2006.01)
  *B23K 26/362* (2014.01)

(52) U.S. Cl.
  CPC ............... *H01L 2224/80201* (2013.01); *H01L 2224/80895* (2013.01); *H01L 2224/80896* (2013.01); *H01L 2924/37001* (2013.01)

(56) References Cited

U.S. PATENT DOCUMENTS

| | | |
|---|---|---|
| 2017/0148765 A1 | 5/2017 | Yu et al. |
| 2018/0138164 A1 | 5/2018 | Lee et al. |
| 2021/0057359 A1* | 2/2021 | Hu .......................... H01L 24/05 |
| 2021/0159224 A1* | 5/2021 | Shen ................... H01L 23/5226 |
| 2021/0175192 A1* | 6/2021 | Mueller ................. H01L 24/03 |

* cited by examiner

WAFER BONDING METHOD

PRIORITY CLAIM AND CROSS-REFERENCE

This application claims the benefit of U.S. Provisional Application No. 63/001,163, filed on Mar. 27, 2020, which application is hereby incorporated herein by reference.

BACKGROUND

Since the development of the integrated circuit (IC), the semiconductor industry has experienced continued rapid growth due to continuous improvements in the integration density of various electronic components (e.g., transistors, diodes, resistors, capacitors, etc.). For the most part, these improvements in integration density have come from repeated reductions in minimum feature size, which allows more components to be integrated into a given area. As the demand for miniaturization, higher speed, greater bandwidth, and lower power consumption and latency has grown, there has grown a need for smaller and more creative techniques for packaging semiconductor dies.

Stacked semiconductor devices have emerged as an effective technique for further reducing the physical size of a semiconductor device. In a stacked semiconductor device, active circuits such as logic and memory circuits are fabricated on different semiconductor wafers. Two or more semiconductor wafers may be bonded together through suitable bonding techniques to further reduce the form factor of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
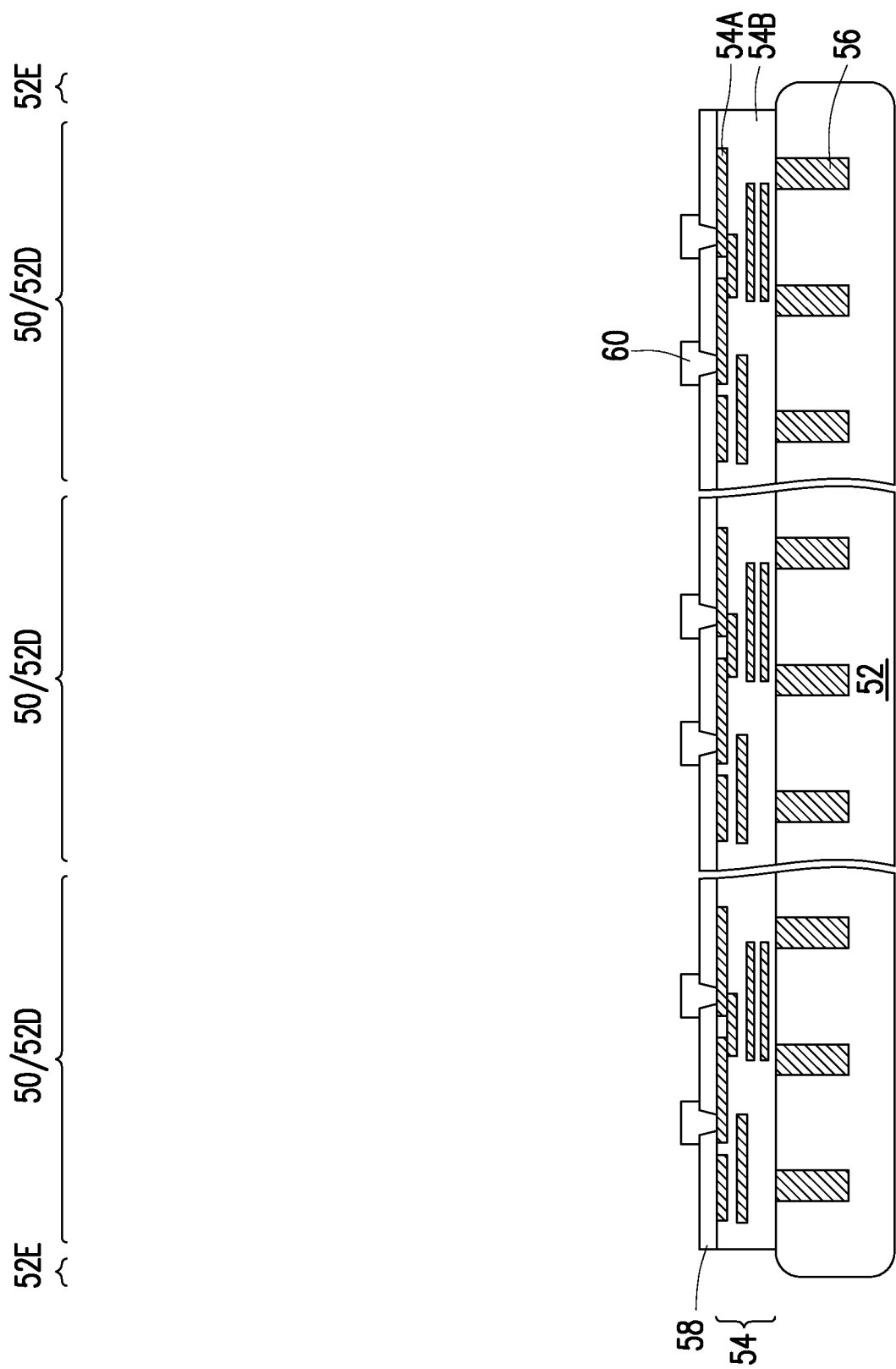
FIGS. 1 through 9 are cross-sectional views of intermediate steps during a process for wafer bonding, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a first wafer (e.g., a top wafer) is processed, tested, and trimmed, and then subsequently bonded to a second wafer (e.g., a bottom wafer). A processed wafer can have rounded or raised edges, such as due to non-uniform chemical mechanical polishing (CMP) that may occur at the wafer's edge during processing. Trimming the edges from the first processed wafer before bonding can increase the uniformity of the bond strength in the resulting bonded wafer structure. Further, trimming the edges from the first processed wafer before bonding can reduce the risk of edge chipping during subsequent thinning of the first processed wafer after bonding, avoiding undesirable particle formation. In accordance with some embodiments, the edges of the first wafer are trimmed using multiple types of trim processes. Specifically, a first trim process is used to trim dielectric features at the edges of the wafer, and a second trim process is subsequently used to trim semiconductor features at the edges of the wafer. In some embodiments, the first trim process is a chemical or ablative process, which allows fragile features such as extra low-K (ELK) dielectric layers to be trimmed at a reduced risk of damage compared to mechanical processes. The yield of the resulting bonded wafer structures may thus be improved, decreasing manufacturing costs.

FIGS. 1 through 9 are cross-sectional views of intermediate steps during a process for wafer bonding, in accordance with some embodiments. As discussed in greater detail below, FIGS. 1 through 9 illustrate a process in which a first processed wafer (see FIG. 1) is trimmed and bonded to a second processed wafer (see FIG. 7). The wafers include multiple integrated circuit dies 50 formed therein and/or thereon. The integrated circuit dies 50 may be logic dies (e.g., a central processing unit (CPU), graphics processing unit (GPU), system-on-a-chip (SoC), application processor (AP), microcontroller, etc.), memory dies (e.g., dynamic random access memory (DRAM) dies, static random access memory (SRAM) dies, etc.), power management dies (e.g., power management integrated circuit (PMIC) dies), radio frequency (RF) dies, sensor dies (e.g., image sensors), micro-electro-mechanical-system (MEMS) dies, signal processing dies (e.g., digital signal processing (DSP) dies), front-end dies (e.g., analog front-end (AFE) dies), the like, or combinations thereof.

In FIG. 1, a first wafer is formed or obtained. The first wafer has multiple device regions 52D, and an integrated circuit die 50 is formed in and/or on each of the device regions 52D. Further, the first wafer has edge regions 52E, which are laterally disposed at the edges of the first wafer and surround the device regions 52D. As discussed in greater detail below, multiple trim processes will be performed in the edge regions 52E. The first wafer includes a semiconductor substrate 52, an interconnect structure 54, conductive vias 56, one or more passivation layer(s) 58, and contact pads 60.

The semiconductor substrate 52 may be silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices are formed at the active surface of the semiconductor substrate 52. The devices may be active devices (e.g., transistors, diodes, etc.) and/or passive device (e.g., capacitors, resistors, etc.). The inactive surface may be free from devices. An inter-layer dielectric (ILD) is over the active surface of the semiconductor substrate 52. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

The interconnect structure 54 is on the active surface of the semiconductor substrate 52. The interconnect structure 54 interconnects the devices at the active surface of the semiconductor substrate 52 to form integrated circuits. The interconnect structure 54 may include, e.g., metallization patterns 54A in dielectric material 54B. The dielectric material 54B may include one or more dielectric layers, such as one or more layers of a low-k (LK) or an extra low-K (ELK) dielectric material. The metallization patterns 54A may be metal interconnects (e.g., metal lines and vias) formed in the one or more dielectric layers. The interconnect structure 54 may be formed by a damascene process, such as a single damascene process, a dual damascene process, or the like. The metallization patterns 54A of the interconnect structure 54 are electrically coupled to the devices at the active surface of the semiconductor substrate 52.

The conductive vias 56 are formed extending into the interconnect structure 54 and/or the semiconductor substrate 52. The conductive vias 56 are electrically coupled to the metallization patterns 54A of the interconnect structure 54. As an example to form the conductive vias 56, recesses can be formed in the interconnect structure 54 and/or the semiconductor substrate 52 by, for example, etching, milling, laser techniques, a combination thereof, and/or the like. A thin dielectric material may be formed in the recesses, such as by using an oxidation technique. A barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, PVD, a combination thereof, and/or the like. Examples of conductive materials are copper, tungsten, aluminum, silver, gold, a combination thereof, and/or the like. Excess of the conductive material and the barrier layer is removed from the surface of the interconnect structure 54 and/or the semiconductor substrate 52 by, for example, a chemical-mechanical polish (CMP). Remaining portions of the barrier layer and the conductive material form the conductive vias 56. In the illustrated embodiment, the conductive vias 56 only extend into the semiconductor substrate 52, but it should be appreciated that the conductive vias 56 can also extend into some (or all) of the layers of the interconnect structure 54.

In the embodiment illustrated, the conductive vias 56 are not yet exposed at the back side of the first wafer, e.g., the back side of the semiconductor substrate 52. Rather, the conductive vias 56 are buried in the semiconductor substrate 52. As discussed in greater detail below, the conductive vias 56 will be exposed at the back side of the first wafer in subsequent processing. After exposure, the conductive vias 56 can be referred to as through-silicon vias or through-substrate vias (TSVs).

The passivation layer(s) 58 are formed on the interconnect structure 54. The passivation layer(s) 58 may be formed of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), a benzocyclobutene (BCB) based polymer, molding compound, the like, or a combination thereof. The passivation layer(s) 58 may be formed by spin coating, lamination, chemical vapor deposition (CVD), the like, or a combination thereof. In some embodiments, the passivation layer(s) 58 include a silicon nitride layer and a silicon oxide layer on the silicon nitride layer.

The contact pads 60 are formed extending through the passivation layer(s) 58 to physically and electrically couple to the metallization patterns 54A of the interconnect structure 54. For example, the contact pads 60 may be physically and electrically coupled to metal features that are part of the topmost metallization pattern of the interconnect structure 54. The contact pads 60 are formed of a conductive material such as are aluminum, copper, tungsten, silver, gold, a combination thereof, and/or the like. In some embodiments, the contact pads 60 are formed of a lower-cost conductive material (e.g., aluminum) than the metallization patterns 54A of the interconnect structure 54. As an example to form the contact pads 60, openings may be formed in the passivation layer(s) 58, and a seed layer may be formed along the passivation layer(s) 58 and in the openings through the passivation layer(s) 58. The openings may be formed by acceptable photolithography and etching techniques. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the contact pads 60. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 60.

As discussed in greater detail below, the contact pads 60 will be used for device testing. In some embodiments, the contact pads 60 are test pads that are only used for device testing, and are not electrically coupled or active during normal operation of the integrated circuit dies 50. In some embodiments, the contact pads 60 are die connectors that are used for both device testing and normal operation of the integrated circuit dies 50.

Figure 2:
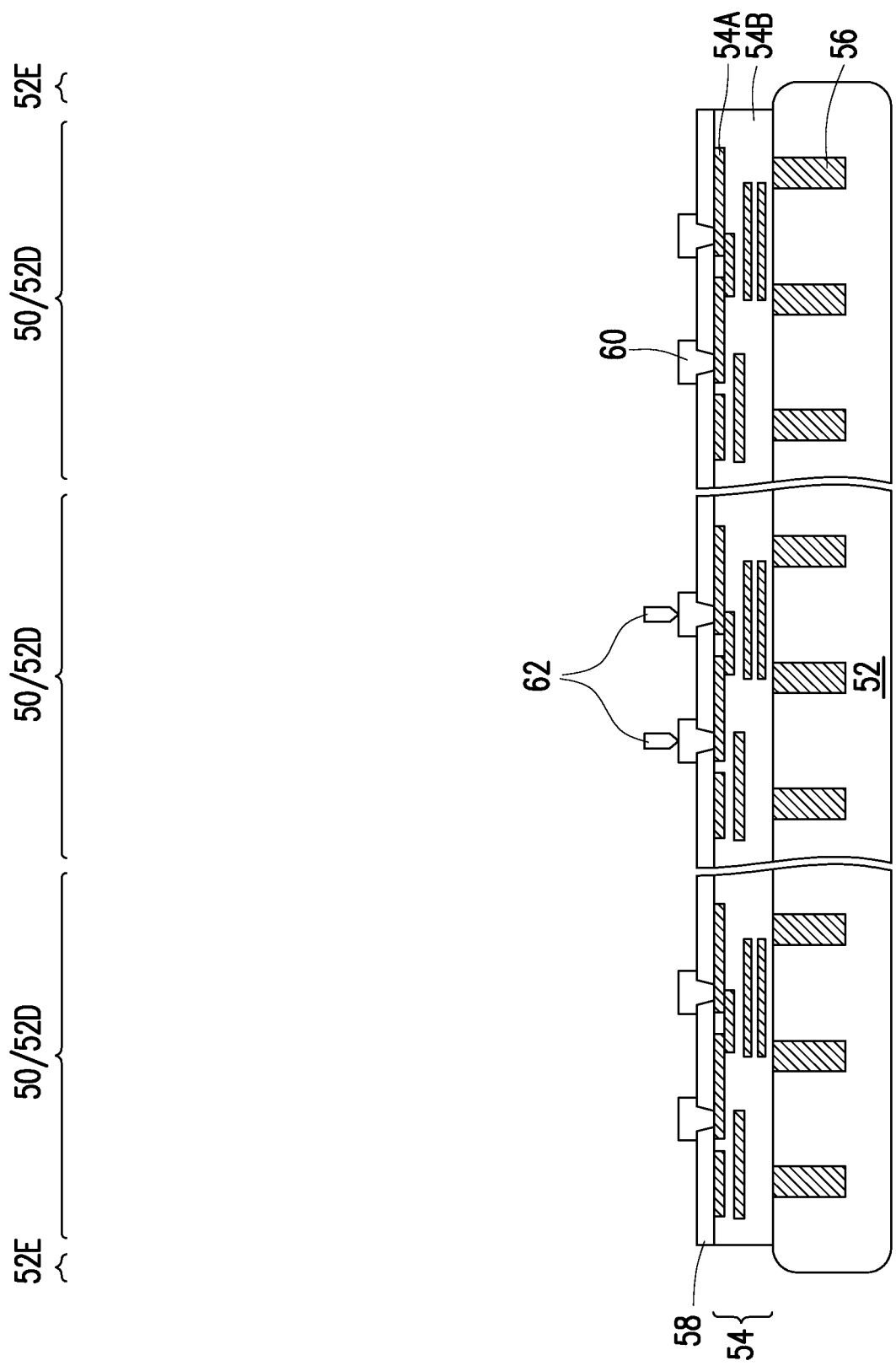

In FIG. 2, circuit probe (CP) testing is performed on the integrated circuit dies 50 to ascertain whether the integrated circuit dies 50 are known good dies (KGDs). The integrated circuit dies 50 are tested by use of a probe 62. The probe 62 is physically and electrically coupled to the contact pads 60 by, e.g., reflowable test connectors. Only wafers with integrated circuit dies 50 which are KGDs undergo subsequent processing and packaging, and wafers with integrated circuit dies 50 which fail the CP testing are not packaged. The testing may include testing of the functionality of the various integrated circuit dies 50, or may include testing for known open or short circuits that may be expected based on the design of the integrated circuit dies 50. After testing is complete, the probe 62 is removed and any excess reflowable material on the contact pads 60 may be removed by, e.g., an etching process, a chemical-mechanical polish (CMP), a grinding process, or the like.

Figure 3:
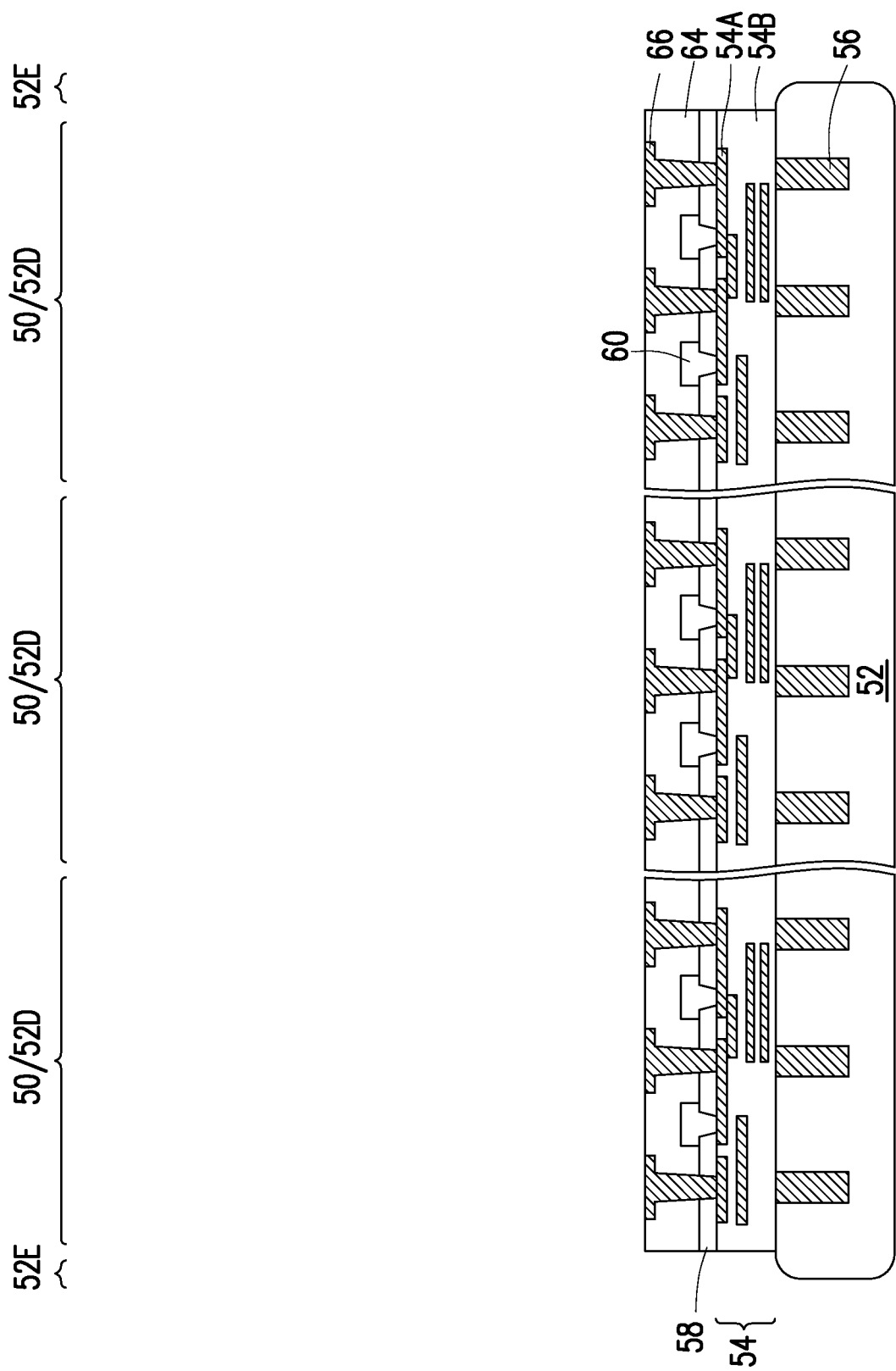

In FIG. 3, a dielectric layer 64 is formed at the front side of the wafer, e.g., on the contact pads 60 and the passivation layer(s) 58. The dielectric layer 64 buries the contact pads 60. When the contact pads 60 are test pads, the test pads will remain electrically isolated in the resulting integrated circuit dies 50. The dielectric layer 64 may be a polymer such as PBO, polyimide, a BCB-based polymer, or the like; a nitride such as silicon nitride or the like; an oxide such as silicon oxide, a tetraethyl orthosilicate (TEOS) based oxide, phosphosilicate glass (PSG), borosilicate glass (BSG), boron-doped phosphosilicate glass (BPSG), or the like; the like; or a combination thereof. The dielectric layer 64 may be formed, for example, by spin coating, lamination, deposition (e.g., CVD), or the like.

Die connectors 66 are formed extending through the dielectric layer 64 and the passivation layer(s) 58 to physically and electrically couple to the metallization patterns 54A of the interconnect structure 54. The die connectors 66 are electrically coupled to the respective integrated circuits of the integrated circuit dies 50. The die connectors 66 may include through vias or conductive pillars, and may be formed of a metal such as copper. In the illustrated embodiment, the die connectors 66 each include a contact pad portion and a via portion, where the via portion connects the contact pad portion to the metallization patterns 54A of the interconnect structure 54. The die connectors 66 may be formed by a damascene process, such as a single damascene process, a dual damascene process, or the like. After formation, the die connectors 66 and the dielectric layer 64 can be planarized. The planarization may be performed by an etching process, a chemical-mechanical polish (CMP), a grinding process, or the like.

In another embodiment, the die connectors 66 are formed before the dielectric layer 64. For example, the die connectors 66 can be formed in a similar manner as the contact pads 60 (e.g., can be die connectors), and the dielectric layer 64 can then be deposited on the die connectors 66. The die connectors 66 and the dielectric layer 64 can then be planarized in a similar manner as described above to expose the die connectors 66.

After formation, the dielectric layer 64, the passivation layer(s) 58, and/or the dielectric material 54B can extend into the edge regions 52E. For example, when such layers are formed by a conformal deposition process, the layers can be formed in the edge regions 52E. As discussed in greater detail below, portions of these layers in the edge regions 52E will be removed by performing multiple trim processes.

Figure 4:
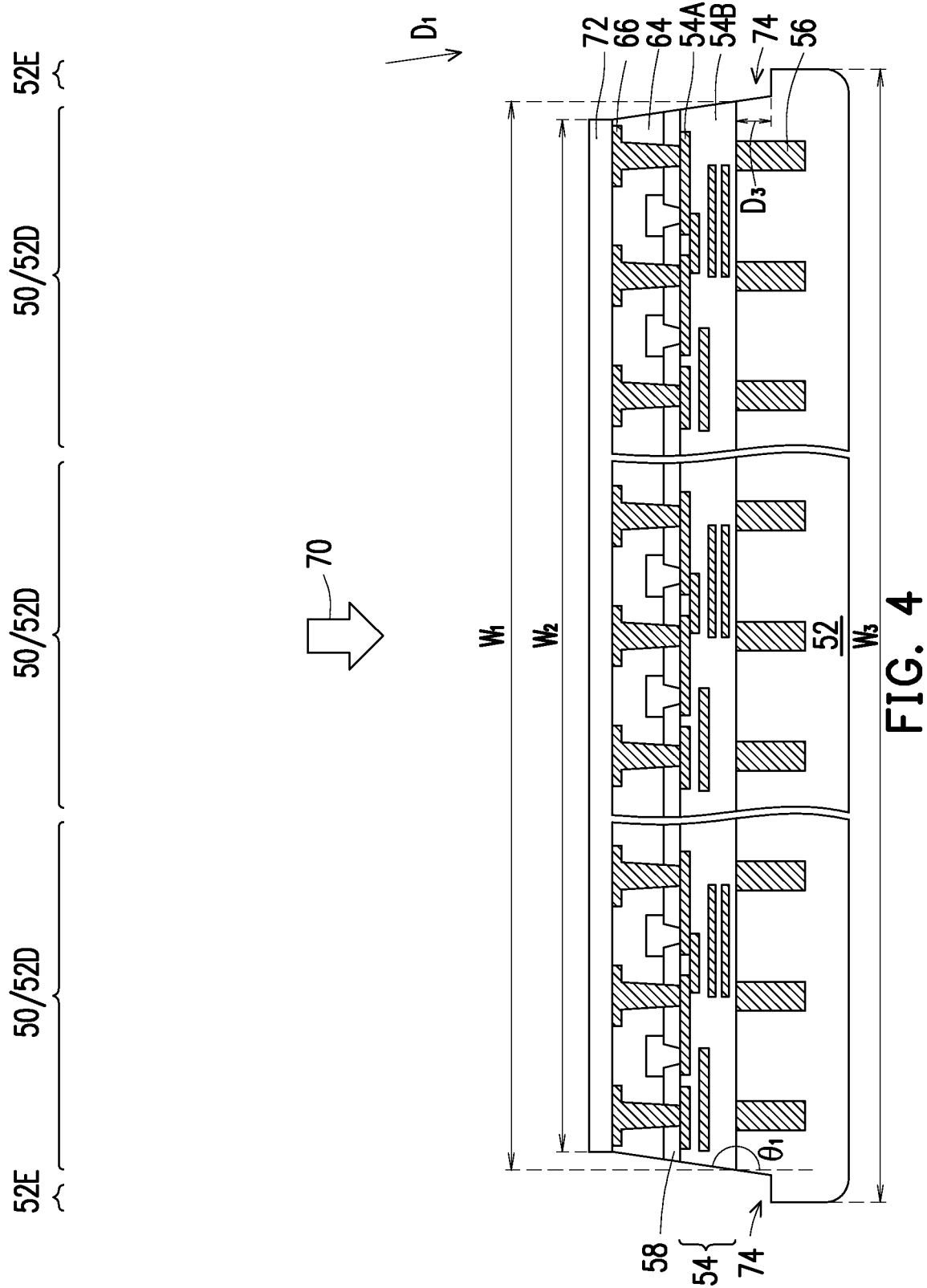

In FIG. 4, a first trim process 70 is performed to remove edge regions of the dielectric layer 64, the passivation layer(s) 58, and the interconnect structure 54. Specifically, the portions of the dielectric layer 64, the passivation layer(s) 58, and the dielectric material 54B in the edge regions 52E are removed by performing the first trim process 70. A mask 72 can be used to cover portions of the dielectric layer 64, the passivation layer(s) 58, and the dielectric material 54B in the device regions 52D during the first trim process 70. As discussed in greater detail below, the first trim process 70 is a non-mechanical process, such as an etching process, such as a chemical process or an ablative process. As noted above, the dielectric material 54B of the interconnect structure 54 can be formed of an ELK material. ELK materials are fragile, and can be easily damaged by mechanical processing. By trimming the interconnect structure 54 with the first trim process 70 (e.g., an etching process), damage to the interconnect structure 54 can be avoided or reduced.

The mask 72 may be formed before performing the first trim process 70. The mask 72 can be formed of a photoresist, such as a single layer photoresist, a bi-layer photoresist, a tri-layer photoresist, or the like. In some embodiments, the mask 72 is a tri-layer mask comprising a bottom layer (e.g., a bottom anti-reflective coating (BARC) layer), a middle layer (e.g., a nitride, an oxide, an oxynitride, or the like), and a top layer (e.g., a photoresist). The mask 72 may be formed by spin coating, a deposition process such as CVD, combinations thereof, or the like. The mask 72 can be patterned using acceptable photolithography techniques so that it covers the device regions 52D and exposes the edge regions 52E. In embodiments where the mask 72 includes a photoresist, the photoresist can be patterned by exposing the photoresist to a patterned energy source (e.g., a patterned light source) so as to induce a chemical reaction, thus inducing a physical change in those portions of the photoresist exposed to the patterned light source. The photoresist can then be developed by applying a developer to the exposed photoresist to take advantage of the physical changes and selectively remove either the exposed portion of the photoresist or the unexposed portion of the photoresist, depending upon the desired pattern.

After the first trim process 70, the trimmed layers (e.g., the dielectric layer 64, the passivation layer(s) 58, and the dielectric material 54B) each have a reentrant profile shape, e.g., have a width that decreases continually in a direction extending away from the active surface of the semiconductor substrate 52. Notably, a width $W_1$ of the bottom surface of the dielectric material 54B is greater than a width $W_2$ of the top surface of the dielectric layer 64. The width $W_1$ can be in the range of about 290 mm to about 299.5 mm, the width $W_2$ can be in the range of about 290 mm to about 299.5 mm. Each of the widths $W_1$, $W_2$ are less than a width $W_3$ of the semiconductor substrate 52. The width $W_3$ can be in the range of about 299.8 mm to about 300.2 mm. Because the trimmed layers each have a reentrant profile shape, the sidewalls of the trimmed layers each form a first obtuse angle $\theta_1$ with a plane parallel to the sidewall of the semiconductor substrate 52. For example, the first obtuse angle $\theta_1$ can be in the range of about 170 degrees to about 180 degrees. The first trim process 70 may thus be considered a directional trim process that is performed along a first direction $D_1$.

The first trim process 70 is selective to the material(s) of the dielectric layer 64, the passivation layer(s) 58, and the dielectric material 54B. In other words, the first trim process 70 selectively removes the dielectric material(s) of the trimmed layers (e.g., the dielectric layer 64, the passivation layer(s) 58, and the dielectric material 54B) at a faster rate than the semiconductor material(s) of the semiconductor substrate 52. For example, the etch selectivity between the dielectric material(s) (e.g., oxides) and the semiconductor material(s) (e.g., silicon), relative the first trim process 70, can be in the range of about 5 to about 50. The profile shape of the trimmed layers can be controlled by controlling parameters of the first trim process 70. Specifically, trimmed layers can each be formed with a reentrant profile shape by performing the first trim process 70 with a high etch selectivity. Performing the first trim process 70 so that it has an etch selectivity in the range discussed above allows the trimmed layers to each have a reentrant profile shape. Performing the first trim process 70 so that it has an etch selectivity outside of the range discussed above may not allow the trimmed layers to have a reentrant profile shape.

In some embodiments, the first trim process 70 is a chemical process, such as plasma etching, performed to have a desired etch selectivity. The mask 72 covers the device regions 52D during the plasma etching process. The plasma etching process is performed in a processing chamber with process gases being supplied into the processing chamber. The process gases can be activated into plasma by any suitable method of generating plasma, such as transformer coupled plasma (TCP) systems, inductively coupled plasma (ICP) systems, capacitively coupled plasma (CCP) systems, magnetically enhanced reactive ion techniques, electron cyclotron resonance techniques, or the like. In some embodiments, plasma generation power is pulsed between a low power and a high power during the plasma etching process. In some embodiments, an applied bias voltage is also pulsed between a low voltage and a high voltage during the plasma etching process. In some embodiments, the plasma generation power and the bias voltage have synchronized pulses, such that the plasma generation power and the bias voltage are simultaneously in their respective low state or high state. The plasma etching process may be performed using a plasma generation power having a high power in the range of about 100 W to about 5000 W. The plasma etching process may be performed using a bias voltage having a high voltage in the range of about 100 volts to about 5000 volts. In some embodiments, the plasma generation power or the bias voltage may be pulsed with a duty cycle in the range of about 10% to about 90%, and may have a pulse frequency in the range of about 5 Hz to about 5000 Hz. The process gases used in the plasma etching process includes at least one or more etchant gas(es). When etching the dielectric material(s) discussed above (e.g., ELK dielectrics), suitable examples of the etchant gas(es) include a fluorocarbon ($C_xF_y$), a hydrofluorocarbon ($C_xH_yF_z$), oxygen ($O_2$), the like, or combinations thereof. Carrier gases, such as nitrogen, argon, helium, or the like, may be used to carry the process gases into the processing chamber. The plasma etching process may be performed at a temperature in the range of about −20° C. to about 50° C. A pressure in the processing chamber may be in the range of about 1 mTorr to about 500 mTorr. The plasma etching process can be performed for a duration in the range of about 10 seconds to about 600 seconds.

In some embodiments, the first trim process 70 is an ablative process, such as laser etching, performed to have a desired etch selectivity. The laser etching process is performed by performing one or more laser shots, each projected towards the edge regions 52E. In some embodiments, the laser shots are directed towards the edge regions 52E but not the device regions 52D, so that the mask 72 may be omitted. In some embodiments, the laser shots are directed towards the entire active surface of the semiconductor substrate 52 while the mask 72 covers the device regions 52D so that only the edge regions 52E are exposed to the laser shots. The laser used may be a $CO_2$ laser, a UV laser, a green light laser, a fiber laser and Yttrium-Aluminum-Garnet (YAG) laser, or the like. The wavelength of the laser can be in the range of about 300 nm to about 600 nm. The average output power of the laser can be in the range of about 1 W to about 30 W. The laser etching process can be performed for a duration in the range of about $10^{-15}$ seconds to about $10^{-9}$ seconds.

The first trim process 70 can form recesses 74 in the semiconductor substrate 52 by removing some portions of the semiconductor substrate 52 in the edge regions 52E. As noted above the first trim process 70 is performed with a high etch selectivity so that the first trim process 70 selectively removes the dielectric material(s) of the dielectric layer 64, the passivation layer(s) 58, and the dielectric material 54B at a faster rate than the semiconductor material(s) of the semiconductor substrate 52. As such, recesses 74 can be formed to a small depth $D_3$. The depth $D_3$ of the recesses 74 can be in the range of about 10 μm to about 150 μm.

Figure 5:
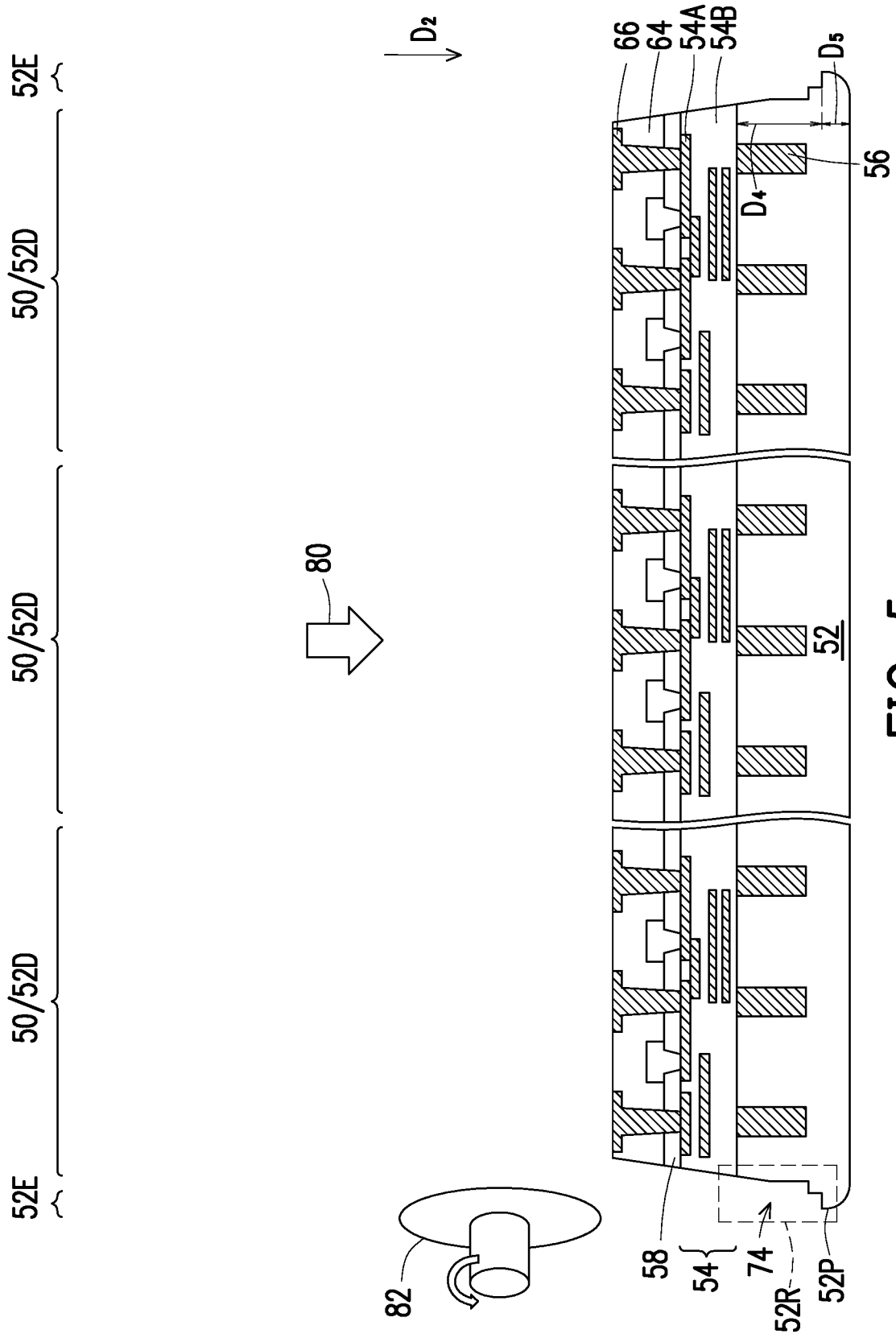

In FIG. 5, a second trim process 80 is performed to remove edge regions of the semiconductor substrate 52. Specifically, some of the portions of the semiconductor substrate 52 in the edge regions 52E are removed by performing the second trim process. The second trim process 80 does not trim some of the layers trimmed by the first trim process 70. Specifically, the second trim process 80 is not used to trim fragile features, such as the interconnect structure 54 when the dielectric material 54B is an ELK material. The second trim process 80 may be a more aggressive trim process than the first trim process 70, e.g., can have a faster removal rate than the first trim process 70. The second trim process 80 is different from the first trim process 70, and can be a different type of trim process. The second trim process 80 can be a mechanical process or an etching process, and in this embodiment is a mechanical process. By trimming the semiconductor substrate 52 with the second trim process 80 (e.g., a mechanical process), the semiconductor substrate 52 may be trimmed more quickly so that wafer processing throughput may be improved.

The second trim process 80 is selective to the material(s) of the semiconductor substrate 52. In other words, the second trim process 80 selectively removes the semiconductor material(s) of the semiconductor substrate 52 at a faster rate than the dielectric material(s) of the dielectric layer 64, the passivation layer(s) 58, and the dielectric material 54B. For example, when the second trim process 80 is an etching process, the etch selectivity between the semiconductor material(s) and the dielectric material(s), relative the second trim process 80, can be in the range of about 5 to about 50. Likewise, when the second trim process 80 is a mechanical process, the removal rate of the dielectric material(s) can be zero, and the removal rate of the semiconductor material(s) can be non-zero.

The second trim process 80 deepens the recesses 74 in the semiconductor substrate 52 by removing some portions of the semiconductor substrate 52 in the edge regions 52E. A majority of the material of the semiconductor substrate 52 in the edge regions 52E is removed, but some portions 52P of the semiconductor substrate 52 remain in the edge regions 52E. After the first trim process 70 and the second trim process 80, the recesses 74 have a depth $D_4$. The portions 52P of the semiconductor substrate 52 remaining in the edge regions 52E have a depth $D_5$, which is less than the depth $D_4$. The depth $D_4$ can be in the range of about 20 µm to about 300 µm, and the depth $D_5$ can be in the range of about 475 µm to about 755 µm. The portions 52P of the semiconductor substrate 52 remaining in the edge regions 52E are thin enough that they can be subsequently removed by an etching or grinding process (discussed in greater detail below). The recesses 74 are deepend along a second direction $D_2$ that is perpendicular to the active surface of the semiconductor substrate 52. The second trim process 80 may thus be considered a directional trim process that is performed along the second direction $D_2$. Notably, the first trim process 70 and the second trim process 80 are performed along different directions. The first direction $D_1$ (see FIG. 4) and the second direction $D_2$ form the first obtuse angle $\theta_1$ (see FIG. 4).

Figure 6:
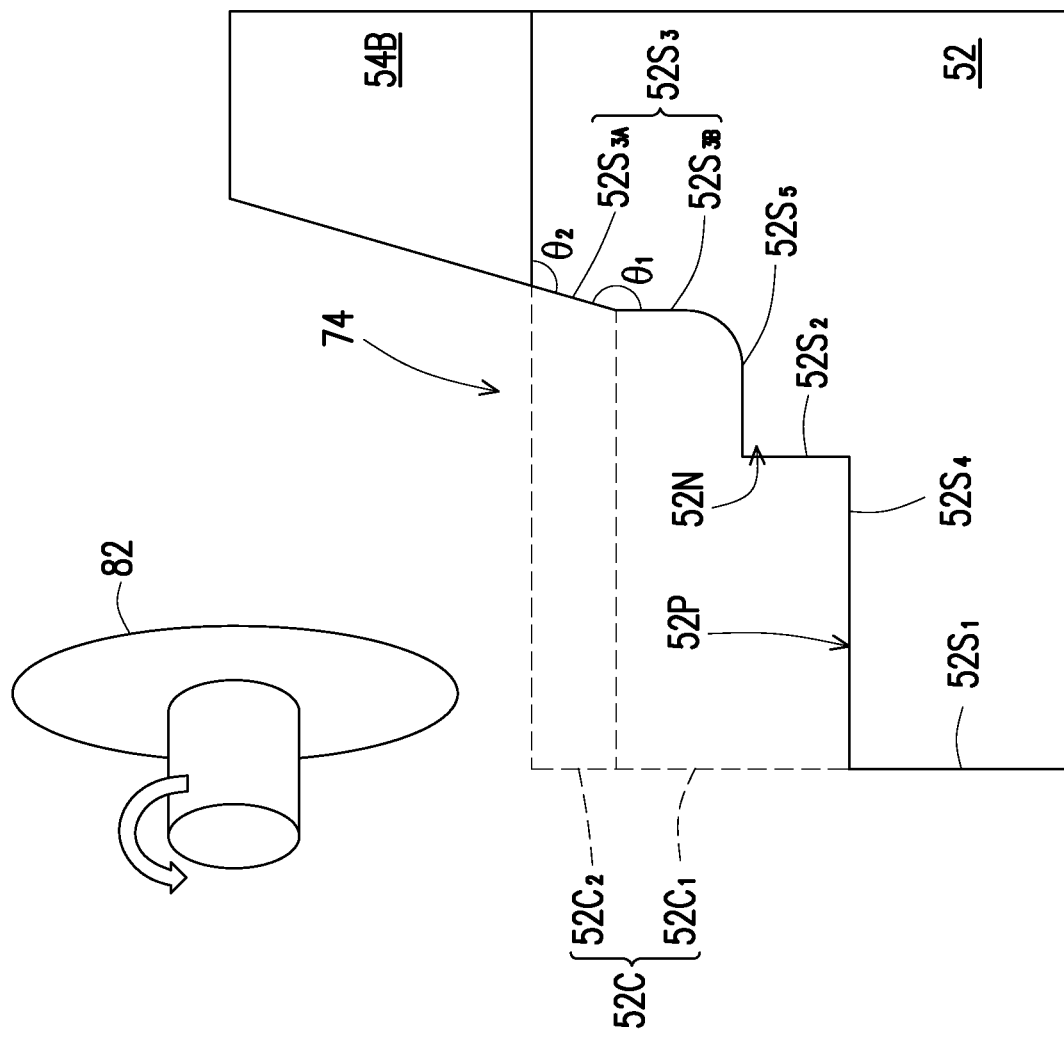

In this embodiment, the second trim process 80 is a mechanical process, such as sawing. A sawing process can be performed by applying a rotating dicing blade 82, such as a half-cut dicing blade, to the edge regions 52E of the semiconductor substrate 52. FIG. 6 is a detailed view of a region 50R after the sawing process. The first trim process 70 and the second trim process 80 collectively remove a cut region 52C from the semiconductor substrate 52. Specifically, the first trim process 70 removes a first portion of the cut region $52C_1$ and the second trim process 80 removes a second portion of the cut region $52C_2$. In the illustrated embodiment, the dicing blade 82 is shaped so that after the sawing process, the semiconductor substrate 52 has a first sidewall $52S_1$, a second sidewall $52S_2$, and a third sidewall $52S_3$ in each edge region 52E. The third sidewall $52S_3$ has several portions. Specifically, the third sidewall $52S_3$ has a first portion $52S_{3A}$ and a second portion $52S_{3B}$. The first portion $52S_{3A}$ connects the second portion $52S_{3B}$ to the active surface of the semiconductor substrate 52. The first portion $52S_{3A}$ forms the first obtuse angle $\theta_1$ (discussed above) with the second portion $52S_{3B}$, and also form a second obtuse angle $\theta_2$ with the active surface of the semiconductor substrate 52. The second obtuse angle $\theta_2$ can be in the range of about 90 degrees to about 100 degrees. The second portion $52S_{3B}$ is perpendicular to a plane that is parallel with the active surface of the semiconductor substrate 52. The first sidewall $52S_1$ and the second sidewall $52S_2$ are connected by a straight segment $52S_4$. The second sidewall $52S_2$ and the third sidewall $52S_3$ are connected by a curved segment $52S_5$. The second sidewall $52S_2$ and the curved segment $52S_5$ together define a notch 52N at the corner of the cut region 52C. The cut region 52C may have other shapes (discussed in greater detail below) depending on the type and parameters of the second trim process 80.

Figure 7:
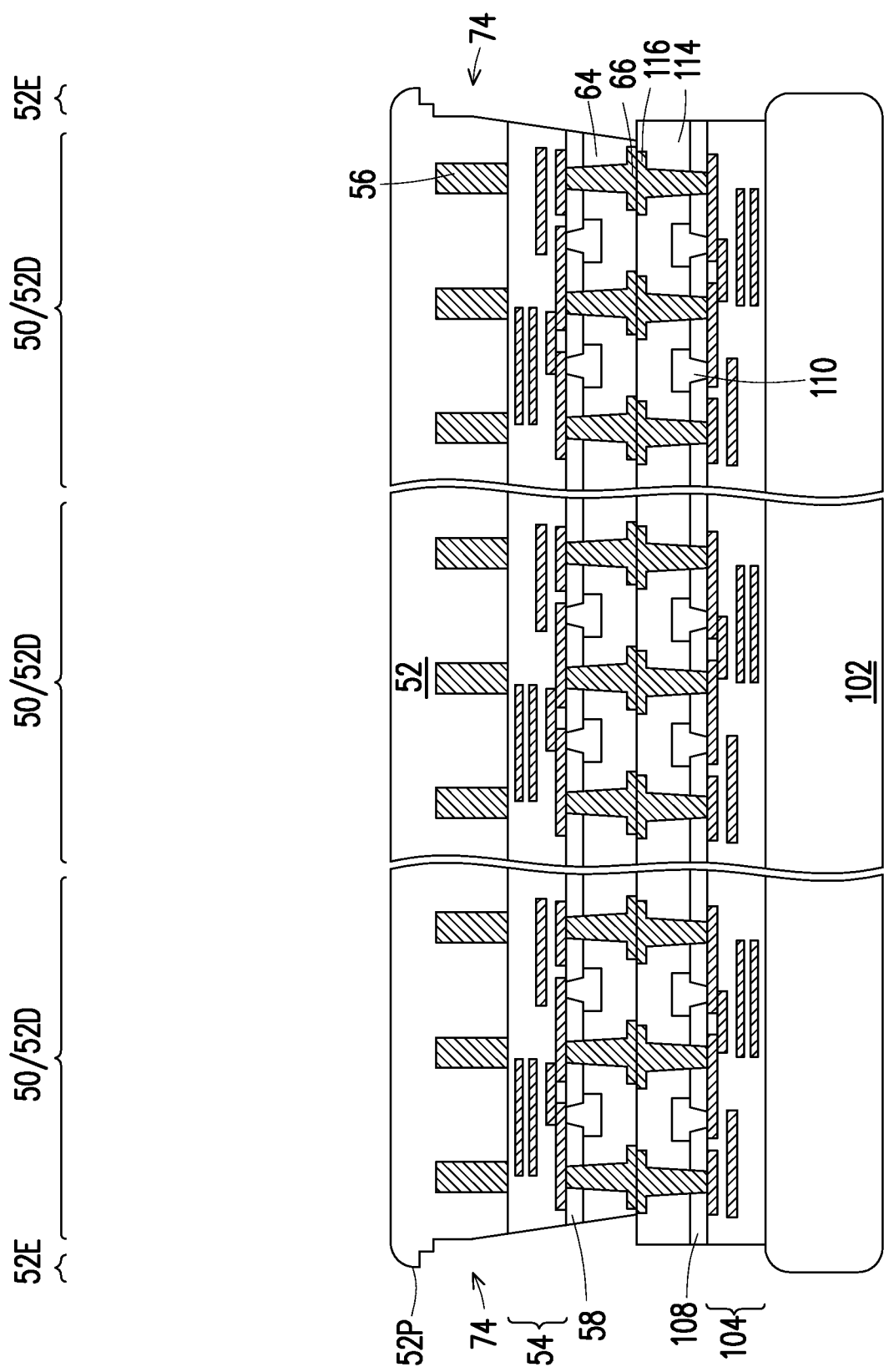

In FIG. 7, a second wafer is formed or obtained. The second wafer includes a semiconductor substrate 102, an interconnect structure 104, one or more passivation layer(s) 108, and contact pads 110, which can be similar to the semiconductor substrate 52, the interconnect structure 54, the passivation layer(s) 58, and the contact pads 60, respectively. A dielectric layer 114 is formed at the front side of the wafer, e.g., on the contact pads 110 and the passivation layer(s) 108. Die connectors 116 are formed extending through the dielectric layer 114 and the passivation layer(s) 108 to physically and electrically couple to the metallization patterns of the interconnect structure 104. The dielectric layer 114 and the die connectors 116 can be similar to the dielectric layer 64 and the die connectors 66, respectively.

The first wafer is then bonded to the second wafer. In the illustrated embodiment, the wafers are bonded in a face-to-face manner by hybrid bonding, such that the front side of the first wafer is bonded to the front side of the second wafer. The dielectric layer 114 is bonded to the dielectric layer 64 through dielectric-to-dielectric bonding, without using any adhesive material (e.g., die attach film), and the die connectors 116 are bonded to the die connectors 66 through metal-to-metal bonding, without using any eutectic material (e.g., solder). The bonding may include a pre-bonding and an annealing. During the pre-bonding, a small pressing force is applied to press the wafers against one another. The pre-bonding is performed at a low temperature, such as room temperature, such as a temperature in the range of about 15° C. to about 30° C., and after the pre-bonding, the dielectric layer 64 and the dielectric layer 114 are bonded to each other. The bonding strength is then improved in a subsequent annealing step, in which the dielectric layer 64 and the dielectric layer 114 are annealed at a high temperature, such as a temperature in the range of about 100° C. to about 400° C. After the annealing, bonds, such as fusions bonds, are formed bonding the dielectric layer 64 and the dielectric layer 114. For example, the bonds can be covalent bonds between the material of the dielectric layer 114 and the material of the dielectric layer 64. The die connectors 66 and the die connectors 116 are connected to each other with a one-to-one correspondence. The die connectors 66 and the die connectors 116 may be in physical contact after the pre-bonding, or may expand to be brought into physical contact during the annealing. Further, during the annealing, the material of the die connectors 66 and the die connectors 116 (e.g., copper) intermingles, so that metal-to-metal bonds are also formed. Hence, the resulting bonds between the wafers are hybrid bonds that include both dielectric-to-dielectric bonds and metal-to-metal bonds.

Figure 8:
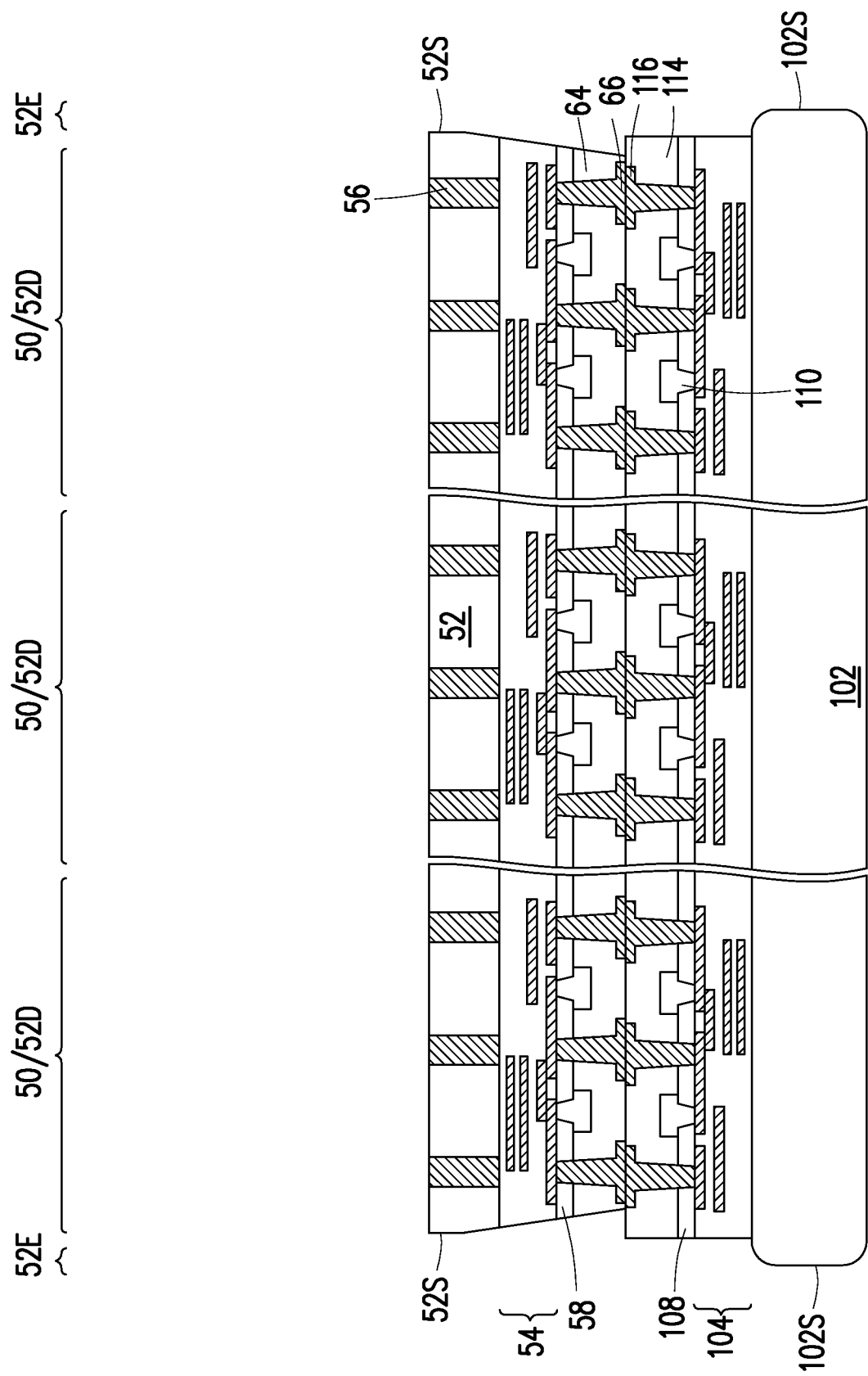

In FIG. 8, the semiconductor substrate 52 is thinned. The thinning may be by a CMP process, a grinding process, an etch back process, the like, or combinations thereof, and is performed on the inactive surface of the semiconductor substrate 52. The thinning exposes the conductive vias 56. After the thinning, surfaces of the conductive vias 56 and the inactive surface of the semiconductor substrate 52 are coplanar (within process variations). As such, the conductive vias 56 are exposed at the back side of the first wafer.

The thinning process removes the portions 52P of the semiconductor substrate 52 remaining in the edge regions 52E. As such, the first sidewall $52S_1$, the second sidewall $52S_2$, the straight segment $52S_4$, the curved segment $52S_5$, and the notch 52N (see FIG. 6) are removed. After the thinning process, only the third sidewalls $52S_3$ of the semiconductor substrate 52 remain. As noted above, the third sidewalls $52S_3$ each have a first portion $52S_{3A}$ and a second portion $52S_{3B}$ (see FIG. 6). The third sidewalls $52S_3$ are the outermost sidewalls 52S of the thinned semiconductor substrate 52. Because the first wafer is trimmed before bonding, the sidewalls 52S, 102S of the semiconductor substrates 52, 102 are laterally offset from one another. For example, the sidewalls 52S of the semiconductor substrate 52 are laterally offset from sidewalls of the semiconductor substrate 102 and sidewalls of the interconnect structure 104. Some shifting can occur during bonding so that centers of the die connectors 66 and the die connectors 116 are not laterally aligned with one another, but enough of the surface area of the die connectors 66 and the die connectors 116 contacts to form electrical connections. Further, because the first wafer is trimmed, the footprint of the semiconductor substrate 52 is laterally confined within the footprint(s) of the semiconductor substrate 102 and the interconnect structure 104.

Figure 9:
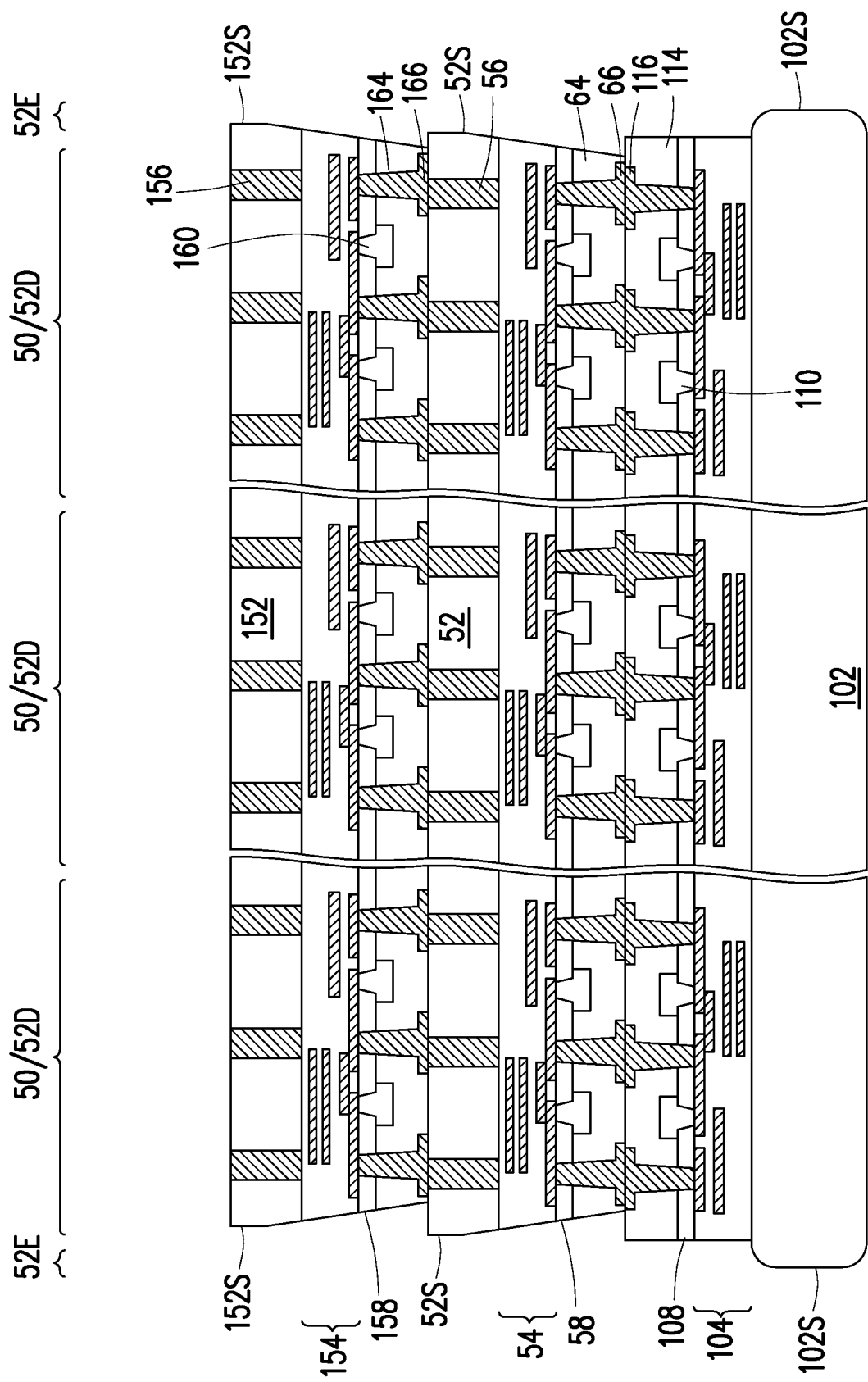

In FIG. 9, a third wafer is formed or obtained. The third wafer includes a semiconductor substrate 152, an interconnect structure 154, conductive vias 156, one or more passivation layer(s) 158, and contact pads 160, which can be similar to the semiconductor substrate 52, the interconnect structure 54, the conductive vias 56, the passivation layer(s) 58, and the contact pads 60, respectively. A dielectric layer 164 is formed at the front side of the wafer, e.g., on the contact pads 160 and the passivation layer(s) 158. Die connectors 166 are formed extending through the dielectric layer 164 and the passivation layer(s) 158 to physically and electrically couple to the metallization patterns of the interconnect structure 154. The dielectric layer 164 and the die connectors 166 can be similar to the dielectric layer 64 and the die connectors 66, respectively.

The third wafer is then bonded to the first wafer. In the illustrated embodiment, the wafers are bonded in a back-to-face manner by hybrid bonding, such that the front side of the third wafer is bonded to the back side of the first wafer. The dielectric layer 164 is bonded to the semiconductor substrate 52 through dielectric-to-dielectric bonding, without using any adhesive material (e.g., die attach film), and the die connectors 166 are bonded to the conductive vias 56 through metal-to-metal bonding, without using any eutectic material (e.g., solder). The bonding may include a pre-bonding and an annealing. During the pre-bonding, a small pressing force is applied to press the wafers against one another. The pre-bonding is performed at a low temperature, such as room temperature, such as a temperature in the range of about 15° C. to about 30° C., and after the pre-bonding, the dielectric layer 164 and the semiconductor substrate 52 are bonded to each other. In some embodiments, an oxide, such as a native oxide, is formed at the back side of the semiconductor substrate 52 and is used for the bonding. The bonding strength is then improved in a subsequent annealing step, in which the dielectric layer 164 and the semiconductor substrate 52 are annealed at a high temperature, such as a temperature in the range of about 100° C. to about 400° C. After the annealing, bonds, such as fusions bonds, are formed bonding the dielectric layer 164 and the semiconductor substrate 52. For example, the bonds can be covalent bonds between the dielectric layer 164 and the semiconductor substrate 52. The die connectors 166 and the conductive vias 56 are connected to each other with a one-to-one correspondence. The die connectors 166 and the conductive vias 56 may be in physical contact after the pre-bonding, or may expand to be brought into physical contact during the annealing. Further, during the annealing, the material of the die connectors 166 and the conductive vias 56 (e.g., copper) intermingles, so that metal-to-metal bonds are also formed. Hence, the resulting bonds between the wafers are hybrid bonds that include both dielectric-to-dielectric bonds and metal-to-metal bonds.

The third wafer can be trimmed before bonding and thinned after bonding, in a similar manner as discussed above, so that the sidewalls 152S of the semiconductor substrate 152 also each have two portions, in a similar manner as third sidewalls 52S₃ of the semiconductor substrate 52 described with respect to FIG. 6. Because the third wafer is trimmed before bonding, the sidewalls of the semiconductor substrate 152 and the semiconductor substrate 52 are laterally offset from one another. For example, the sidewalls 152S of the semiconductor substrate 152 are laterally offset from the sidewalls 52S of the semiconductor substrate 52 and the sidewalls of the interconnect structure 54. Some shifting can occur during bonding so that centers of the die connectors 166 and the conductive vias 56 are not laterally aligned with one another, but enough of the surface area of the die connectors 166 and the conductive vias 56 contacts to form electrical connections. Further, because the third wafer is trimmed, the footprint of the semiconductor substrate 152 is laterally confined within the footprint(s) of the semiconductor substrate 102 and the interconnect structure 104.

It should be appreciated that the steps described with respect to FIGS. 7 through 9 may be repeated any desired quantity of times to form a stack of wafers. For example, the stack may include four wafers, eight wafers, or the like. After wafer bonding is completed, a singulation process is performed by sawing along scribe line regions, e.g., around the device regions 52D. The singulation process separates the device regions 52D from one another to form die stacks.

Figure 10A:
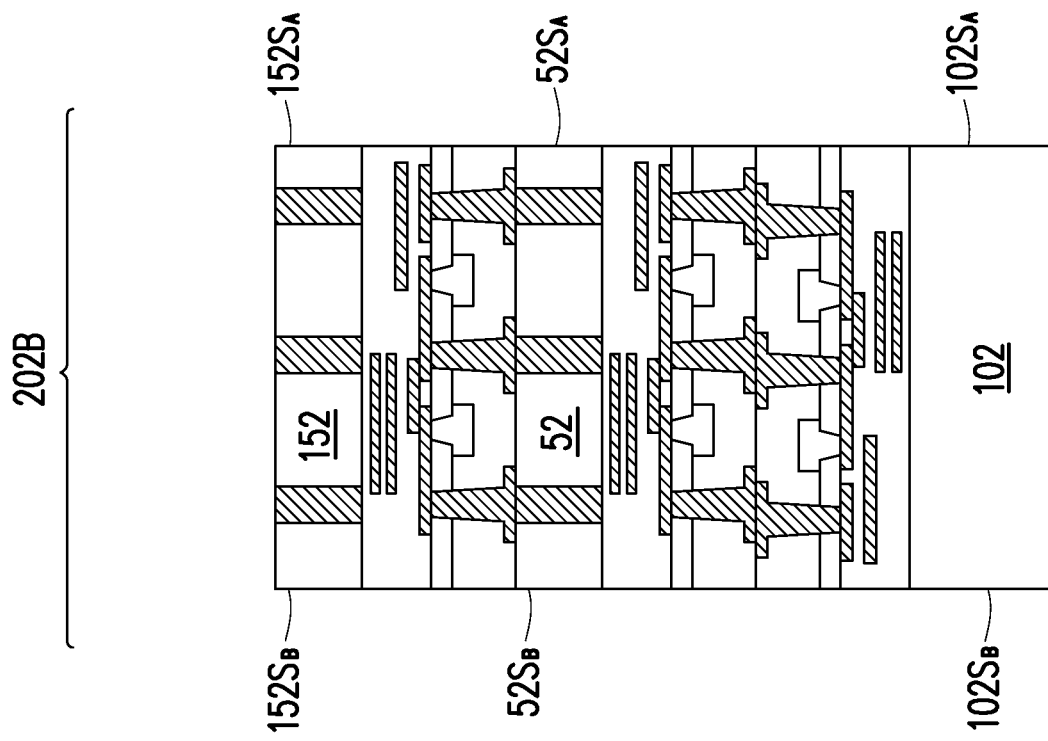
FIGS. 10A and 10B illustrate die stacks, in accordance with some embodiments.
Figure 10B:
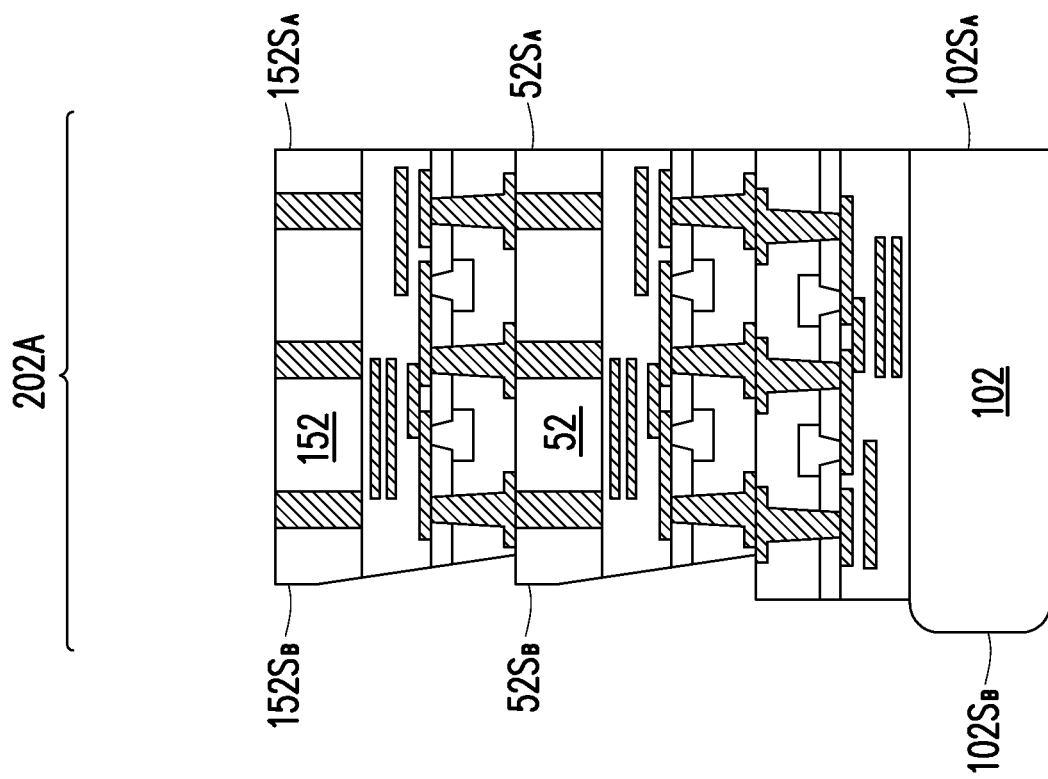

FIGS. 10A and 10B illustrate die stacks, in accordance with some embodiments. FIG. 10A illustrates a first die stack 202A, which is singulated from a device region 52D that is disposed proximate the edge regions 52E. FIG. 10B illustrates a second die stack 202B, which is singulated from a device region 52D that is disposed distal the edge regions 52E, e.g., at a center region of the wafers. For the first die stack 202A, first sidewalls $52S_A$, $102S_A$, $152S_A$ of the semiconductor substrates 52, 102, 152 are laterally coterminous within process variations, however, second sidewalls $52S_B$, $102S_B$, $152S_B$ of the semiconductor substrates 52, 102, 152 are laterally offset from one another. The first sidewalls $52S_A$, $102S_A$, $152S_A$ face an opposite direction than the second sidewalls $52S_B$, $102S_B$, $152S_B$ face. For the second die stack 202B, the first sidewalls $52S_A$, $102S_A$, $152S_A$ of the semiconductor substrates 52, 102, 152 are laterally coterminous (within process variations) and the second sidewalls $52S_B$, $102S_B$, $152S_B$ of the semiconductor substrates 52, 102, 152 are also laterally coterminous. The coterminous sidewalls are those sidewalls that are sawed during singulation. The laterally offset sidewalls are those sidewalls that are trimmed before bonding.

FIGS. 11 through 15 are cross-sectional views of intermediate steps during a process for wafer bonding, in accordance with some other embodiments. In this embodiment, the second trim process 80 is also a non-mechanical process, such as an etching process. As such, the sidewalls of the semiconductor substrate 52 can have a different profile shape than that discussed above with respect to FIG. 6.

Figure 11:
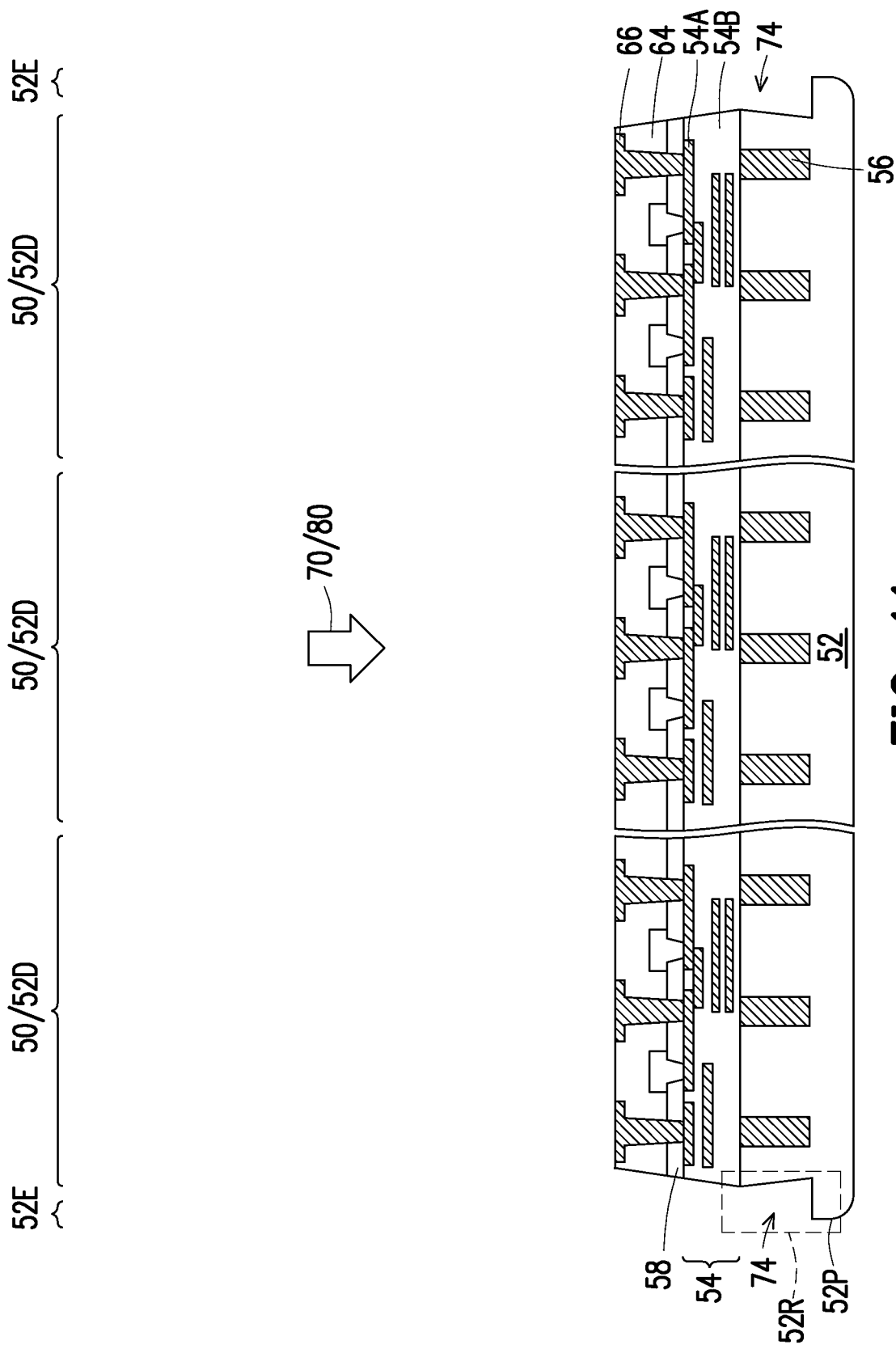
FIGS. 11 through 15 are cross-sectional views of intermediate steps during a process for wafer bonding, in accordance with some other embodiments.

In FIG. 11, a first wafer similar to that described with respect to FIG. 3 is formed or obtained. The first trim process 70 and the second trim process 80 are then performed to remove the edge regions of the semiconductor substrate 52. The second trim process 80 in this embodiment is an etching process, such as a chemical process or an ablative process. The second trim process 80 deepens the recesses 74 in the semiconductor substrate 52 by removing some portions of the semiconductor substrate 52 in the edge regions 52E. As discussed above, the portions 52P of the semiconductor substrate 52 remaining in the edge regions 52E are thin enough that they can be subsequently removed by an etching or grinding process (discussed in greater detail below).

In some embodiments, the second trim process 80 is a chemical process, such as plasma etching. The plasma etching process can be similar to the plasma etching process discussed above with respect to the first trim process 70, except can be performed with some different etching parameters than the first trim process 70. Specifically, the plasma etching process can be performed with different etchant gas(es) and with a different plasma generation power. For example, when etching the semiconductor material(s) of the semiconductor substrate 52, suitable examples of the etchant gas(es) include sulfur hexafluoride ($SF_6$), a hydrofluorocarbon ($C_xH_yF_z$), argon (Ar), oxygen ($O_2$), helium (He), the like, or combinations thereof, and the plasma etching process may be performed using a plasma generation power having a high power in the range of about 100 W to about 5000 W.

In some embodiments, the second trim process 80 is an ablative process, such as laser etching. The laser etching process can be similar to the laser etching process discussed above with respect to the first trim process 70, except can be performed with some different etching parameters than the first trim process 70. Specifically, the laser etching process can be performed at a different wavelength and with a different laser generation power. For example, when etching the semiconductor material(s) of the semiconductor substrate 52, the wavelength of the laser can be in the range of about 300 nm to about 600 nm, and the average output power of the laser can be in the range of about 1 W to about 30 W.

Figure 12:
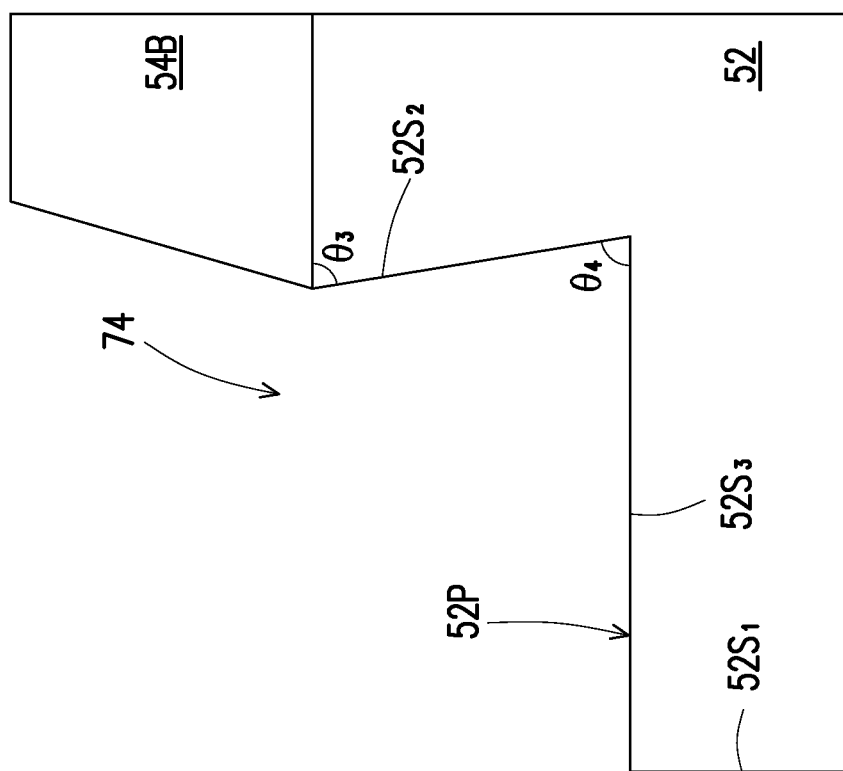

FIG. 12 is a detailed view of a region 50R after the second trim process 80. In the illustrated embodiment, the second trim process 80 is performed so that after the trim process, the semiconductor substrate 52 has a first sidewall $52S_1$ and a second sidewall $52S_2$ in each edge region 52E. The first sidewall $52S_1$ and the second sidewall $52S_2$ are connected by a straight segment $52S_3$. The second sidewall $52S_2$ forms a first acute angle $\theta_3$ with the active surface of the semiconductor substrate 52, and also forms a second acute angle $\theta_4$ with the straight segment $52S_3$. The first acute angle $\theta_3$ can be in the range of about 80 degrees to about 90 degrees, and the second acute angle $\theta_4$ can be in the range of about 80 degrees to about 90 degrees.

Figure 13:
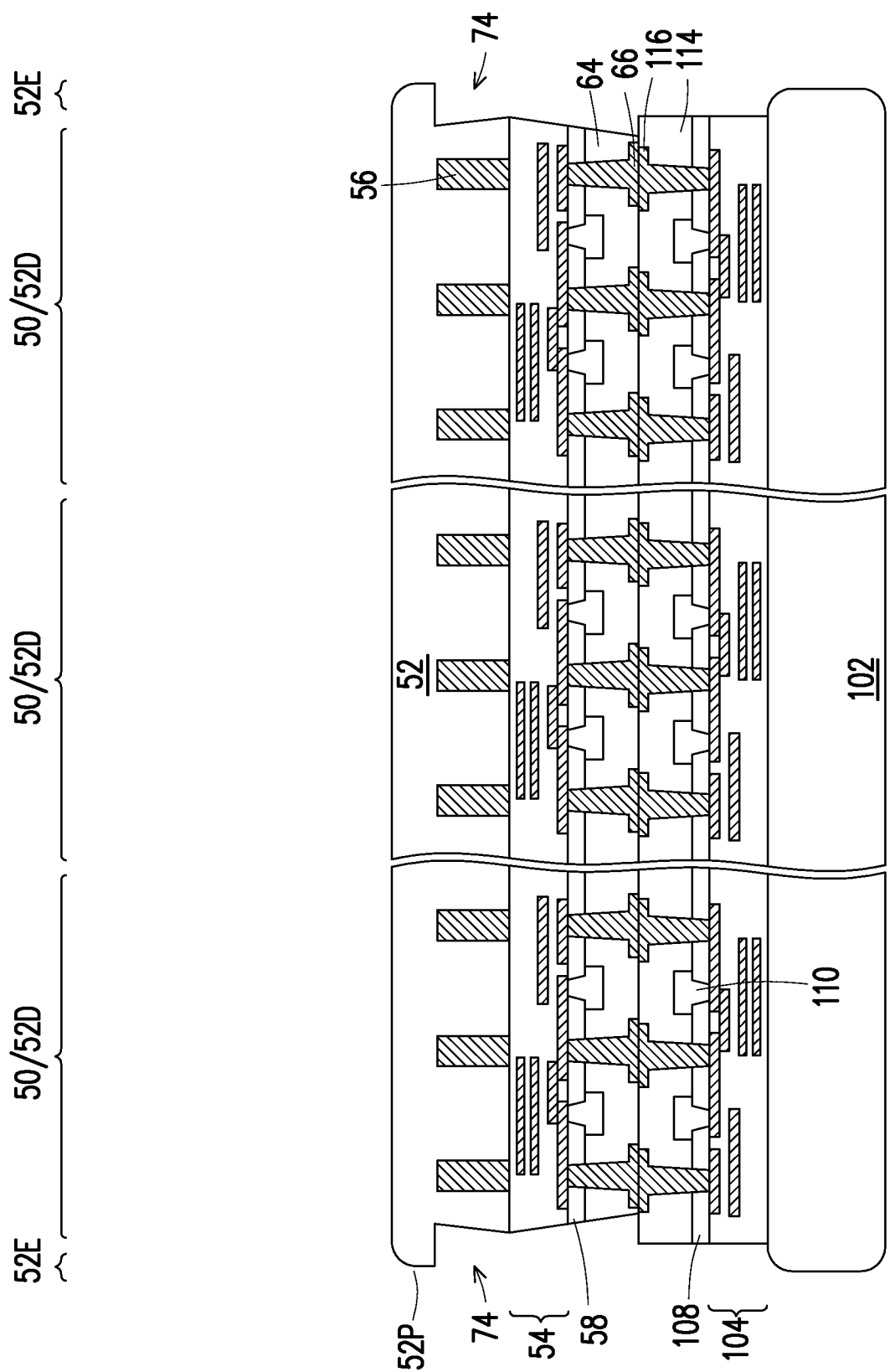

In FIG. 13, a second wafer similar to that described with respect to FIG. 7 is formed or obtained. The first wafer is then bonded to the second wafer. In the illustrated embodiment, the wafers are bonded in a face-to-face manner by hybrid bonding, such that the front side of the first wafer is bonded to the front side of the second wafer.

Figure 14:
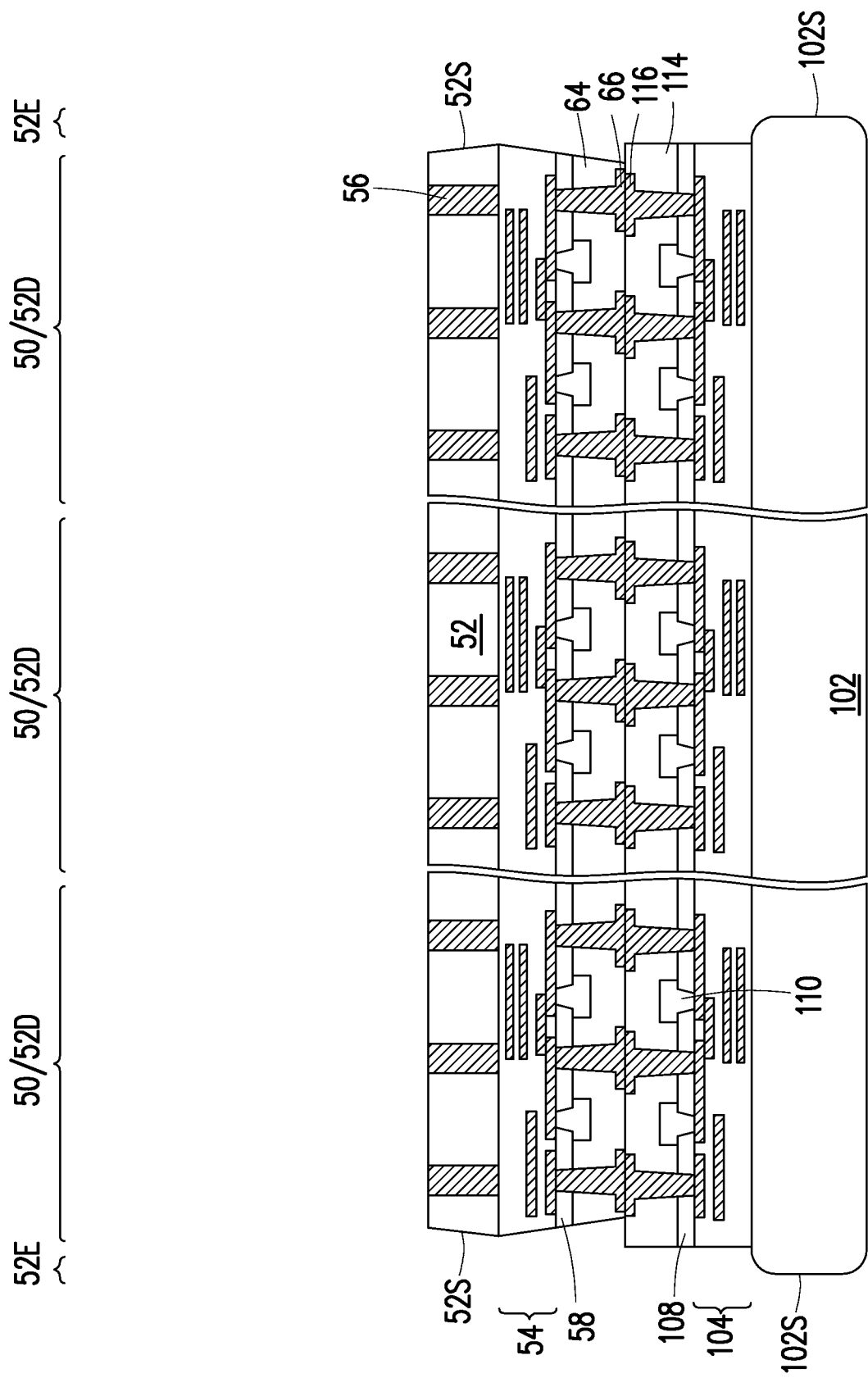

In FIG. 14, the semiconductor substrate 52 is thinned. The thinning may be by a similar process as that described with respect to FIG. 8. After the thinning, surfaces of the conductive vias 56 and the inactive surface of the semiconductor substrate 52 are coplanar (within process variations). As such, the conductive vias 56 are exposed at the back side of the first wafer. Also after the thinning, the sidewalls 52S, 102S of the semiconductor substrates 52, 102 are laterally offset from one another.

Figure 15:
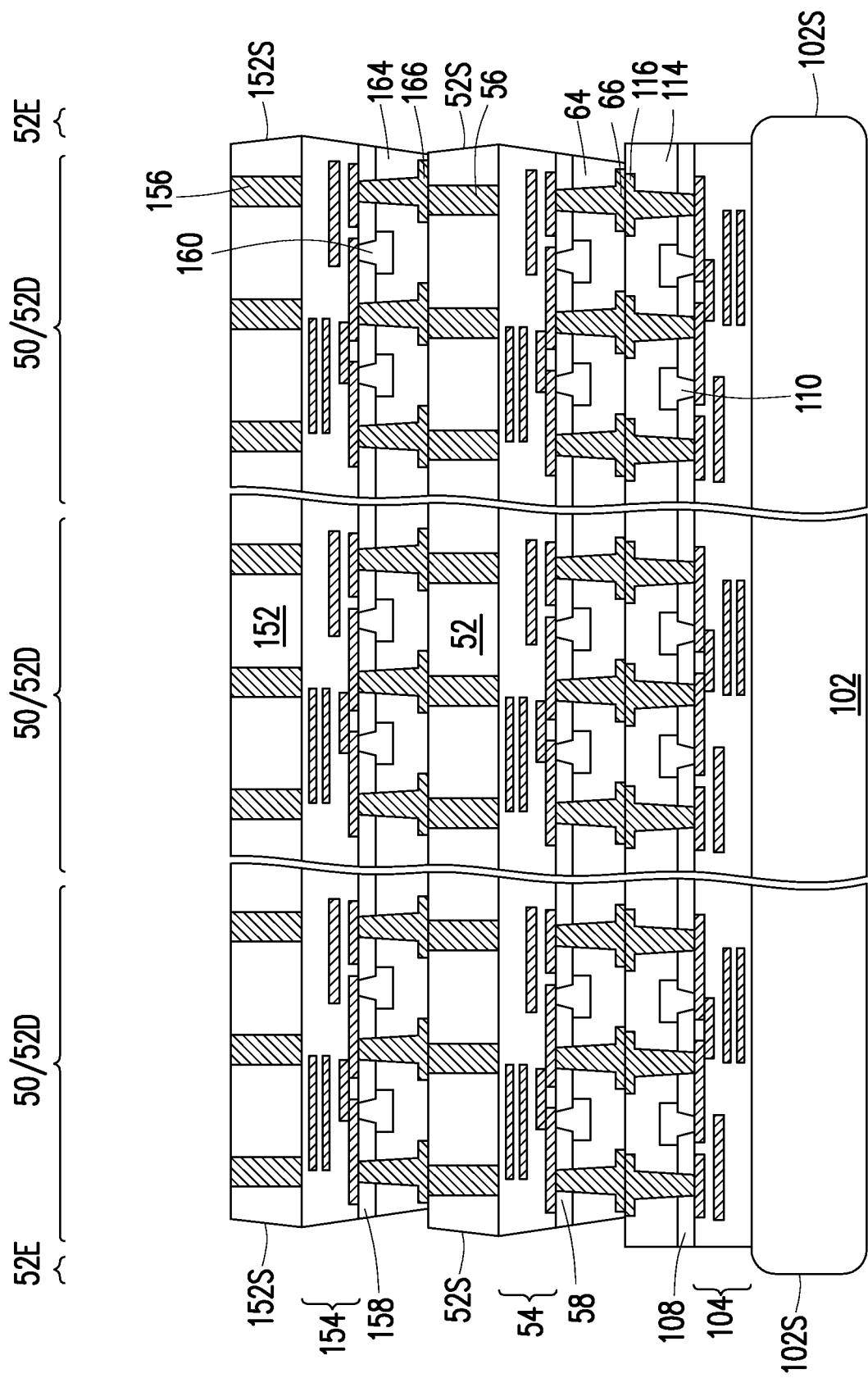

In FIG. 15, a third wafer similar to that described with respect to FIG. 9 is formed or obtained. The third wafer is then bonded to the first wafer. In the illustrated embodiment, the wafers are bonded in a back-to-face manner by hybrid bonding, such that the front side of the third wafer is bonded to the back side of the first wafer.

FIGS. 16 through 20 are cross-sectional views of intermediate steps during a process for wafer bonding, in accordance with some other embodiments. In this embodiment, the second trim process 80 is also a non-mechanical process, such as an etching process. As such, the sidewalls of the semiconductor substrate 52 can have a different profile shape than that discussed above with respect to FIG. 6. Further, in this embodiment, the parameters of the second trim process 80 are modified so that the sidewalls of the semiconductor substrate 52 can have a different profile shape than that discussed above with respect to FIG. 12.

Figure 16:
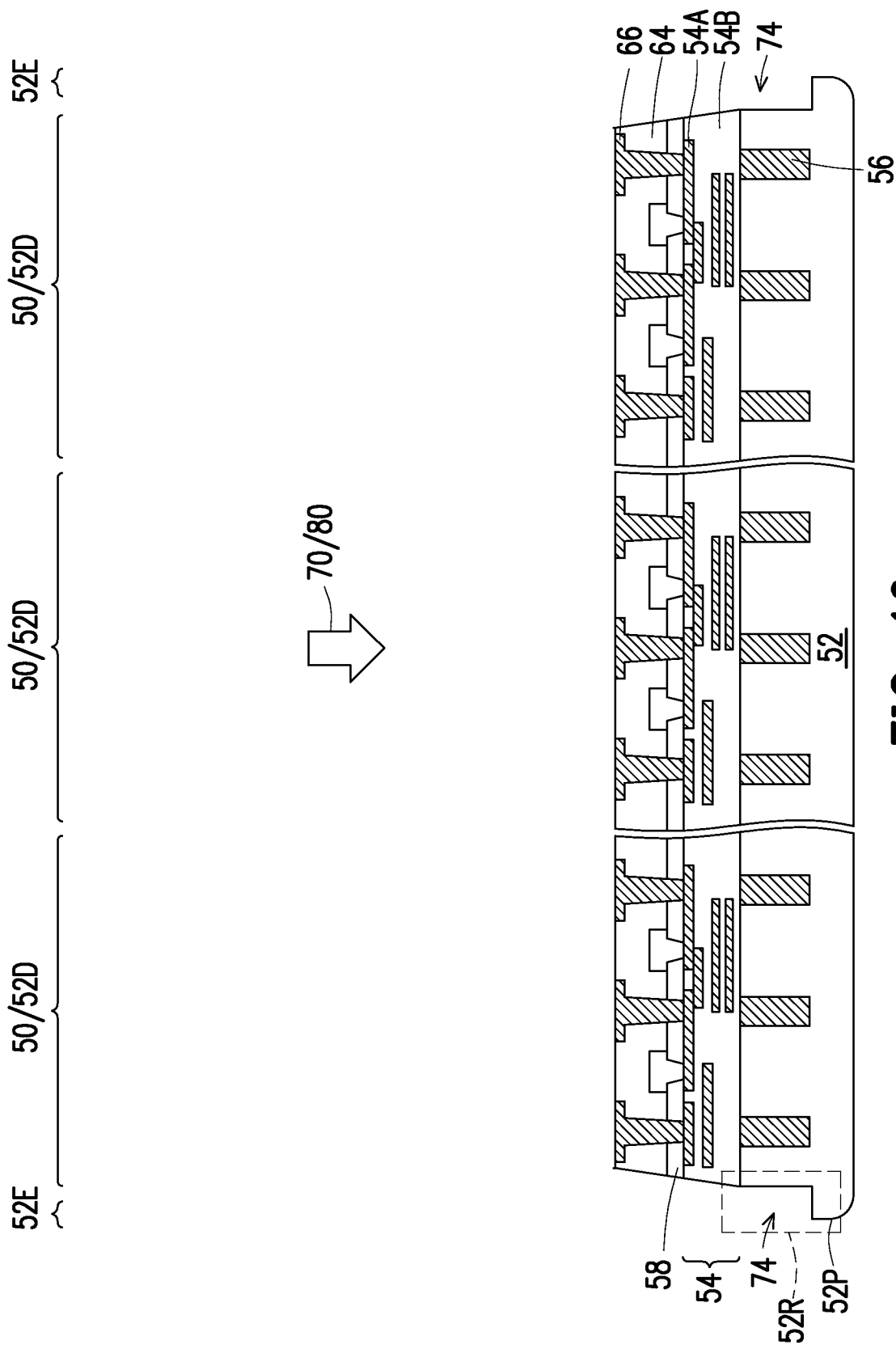
FIGS. 16 through 20 are cross-sectional views of intermediate steps during a process for wafer bonding, in accordance with some other embodiments.

In FIG. 16, a first wafer similar to that described with respect to FIG. 3 is formed or obtained. The first trim process 70 and the second trim process 80 are then performed to remove the edge regions of the semiconductor substrate 52. The second trim process 80 in this embodiment is an etching process, such as a chemical process or an ablative process. The second trim process 80 deepens the recesses 74 in the semiconductor substrate 52 by removing some portions of the semiconductor substrate 52 in the edge regions 52E. As discussed above, the portions 52P of the semiconductor substrate 52 remaining in the edge regions 52E are thin enough that they can be subsequently removed by an etching or grinding process (discussed in greater detail below).

In some embodiments, the second trim process 80 is a chemical process, such as plasma etching. The plasma etching process can be similar to the plasma etching process discussed above with respect to the first trim process 70, except can be performed with some different etching parameters than the first trim process 70. Specifically, the plasma etching process can be performed with different etchant gas(es) and with a different plasma generation power. For example, when etching the semiconductor material(s) of the semiconductor substrate 52, suitable examples of the etchant gas(es) include sulfur hexafluoride ($SF_6$), a hydrofluorocarbon ($C_xH_yF_z$), argon (Ar), oxygen ($O_2$), helium (He), the like, or combinations thereof, and the plasma etching process may be performed using a plasma generation power having a high power in the range of about 100 W to about 5000 W.

In some embodiments, the second trim process 80 is an ablative process, such as laser etching. The laser etching process can be similar to the laser etching process discussed above with respect to the first trim process 70, except can be performed with some different etching parameters than the first trim process 70. Specifically, the laser etching process can be performed at a different wavelength and with a different laser generation power. For example, when etching the semiconductor material(s) of the semiconductor substrate 52, the wavelength of the laser can be in the range of about 300 nm to about 600 nm, and the average output power of the laser can be in the range of about 1 W to about 30 W.

Figure 17:
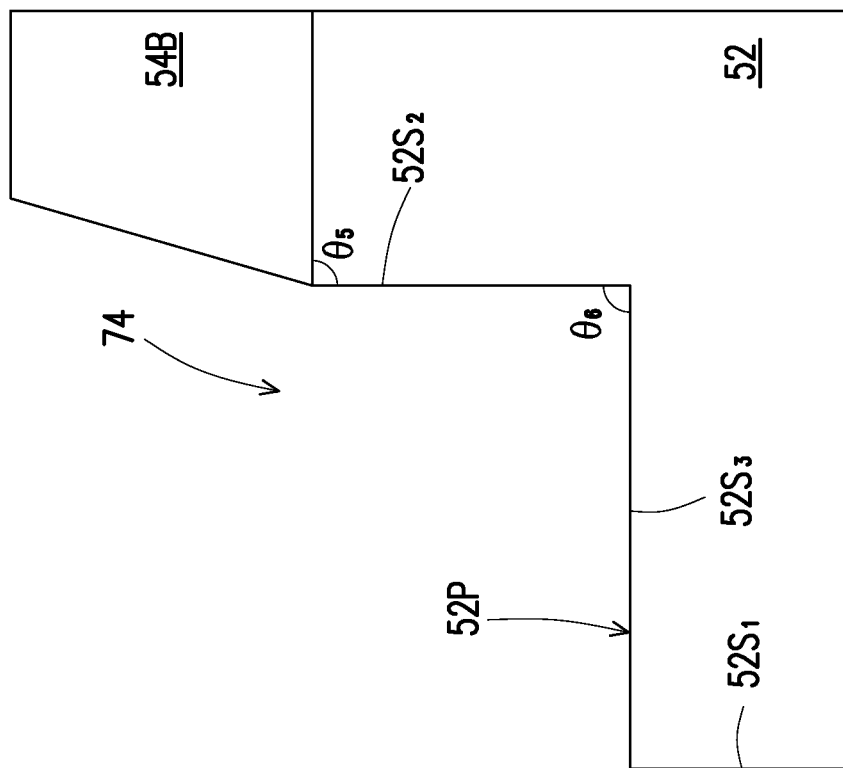

FIG. 17 is a detailed view of a region 50R after the second trim process 80. In the illustrated embodiment, the second trim process 80 is performed so that after the trim process, the semiconductor substrate 52 has a first sidewall $52S_1$ and a second sidewall $52S_2$ in each edge region 52E. The first sidewall $52S_1$ and the second sidewall $52S_2$ are connected by a straight segment $52S_3$. The second sidewall $52S_2$ forms a first right angle $\theta_5$ with the active surface of the semiconductor substrate 52, and also forms a second right angle $\theta_6$ with the straight segment $52S_3$.

Figure 18:
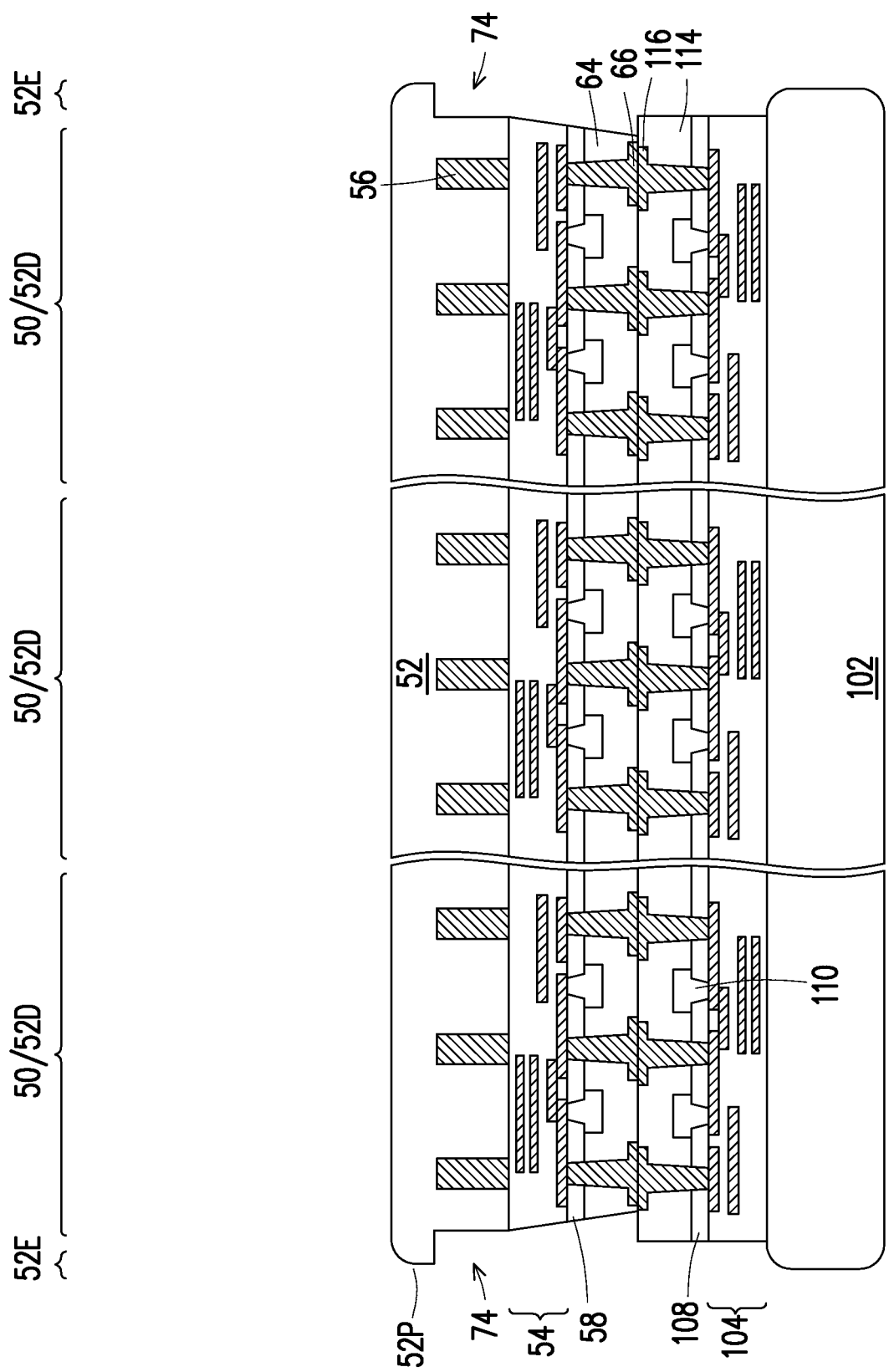

In FIG. 18, a second wafer similar to that described with respect to FIG. 7 is formed or obtained. The first wafer is then bonded to the second wafer. In the illustrated embodiment, the wafers are bonded in a face-to-face manner by hybrid bonding, such that the front side of the first wafer is bonded to the front side of the second wafer.

Figure 19:
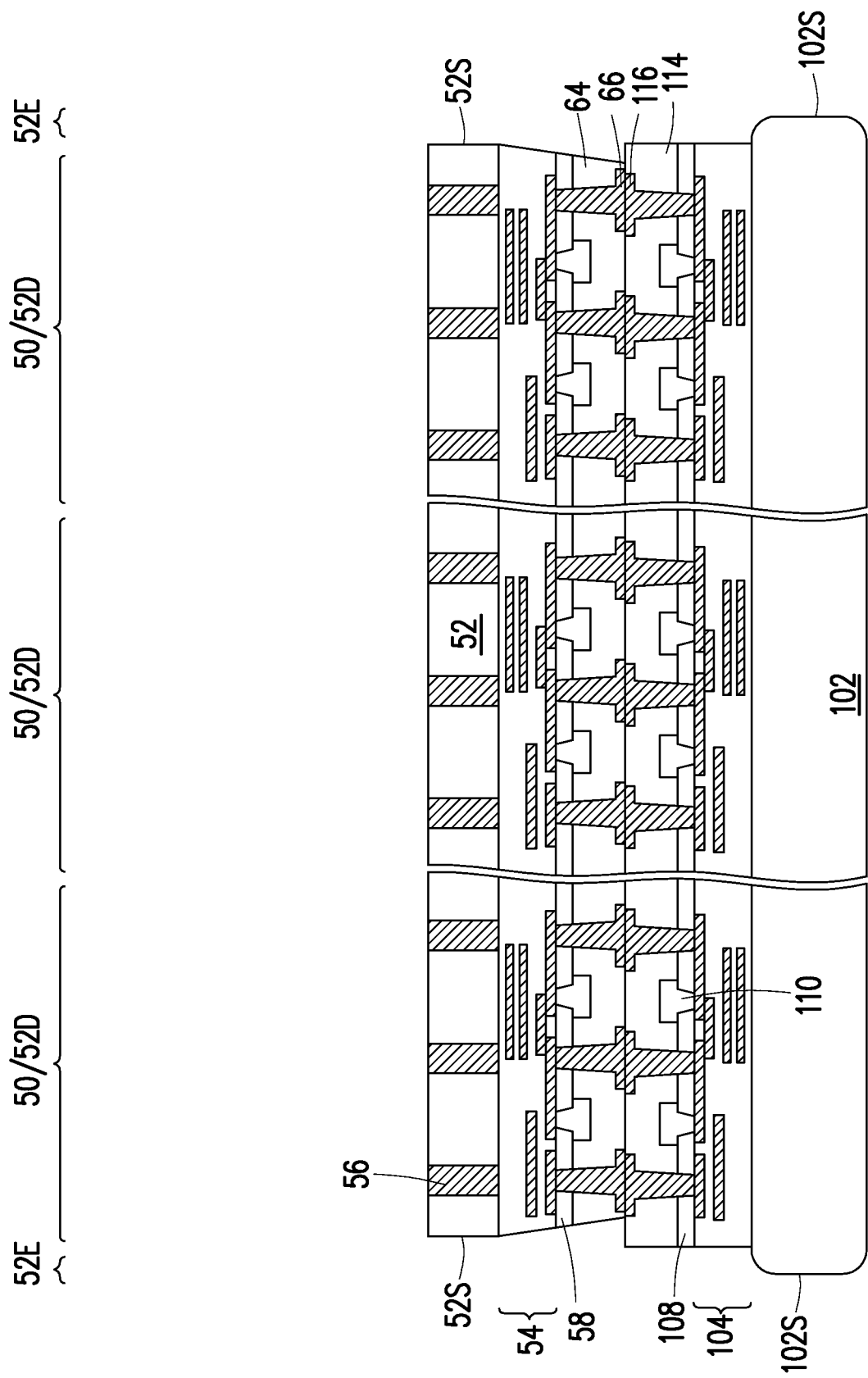

In FIG. 19, the semiconductor substrate 52 is thinned. The thinning may be by a similar process as that described with respect to FIG. 8. After the thinning, surfaces of the conductive vias 56 and the inactive surface of the semiconductor substrate 52 are coplanar (within process variations). As such, the conductive vias 56 are exposed at the back side of the first wafer. Also after the thinning, the sidewalls 52S, 102S of the semiconductor substrates 52, 102 are laterally offset from one another.

Figure 20:
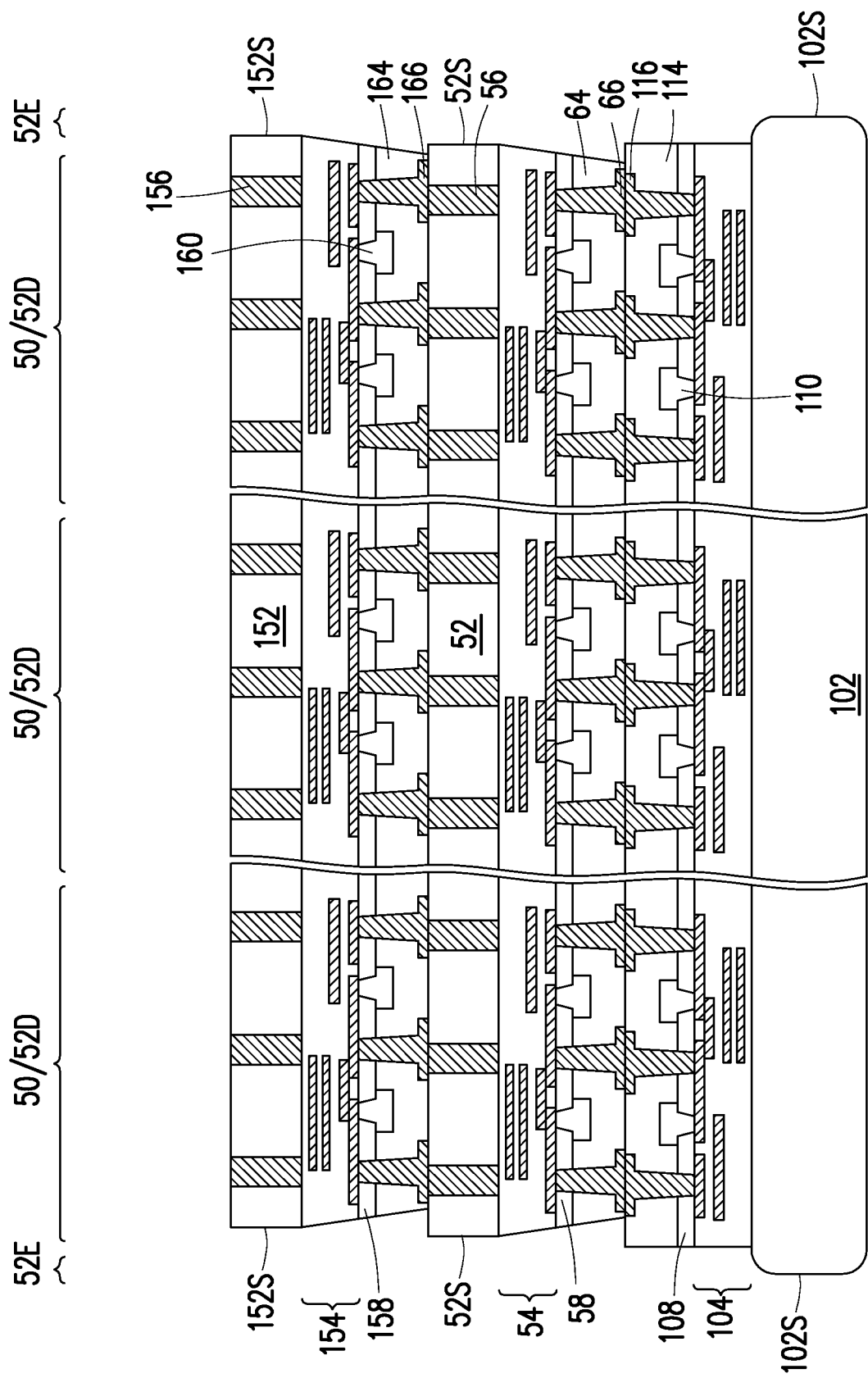

In FIG. 20, a third wafer similar to that described with respect to FIG. 9 is formed or obtained. The third wafer is then bonded to the first wafer. In the illustrated embodiment, the wafers are bonded in a back-to-face manner by hybrid bonding, such that the front side of the third wafer is bonded to the back side of the first wafer. The semiconductor substrate 152 is then thinned. After the thinning, the sidewalls of the semiconductor substrate 152 and the semiconductor substrate 52 are laterally offset from one another.

FIGS. 21 through 25 are cross-sectional views of intermediate steps during a process for wafer bonding, in accordance with some other embodiments. In this embodiment, the first trim process 70 and the second trim process 80 are performed at an earlier stage of wafer processing. The embodiment of FIGS. 21 through 25 is shown using a similar trim process as that described with respect to FIGS. 16 through 20. It should be appreciated that the first trim process 70 and the second trim process 80 can also performed at an earlier stage in the process described with respect to FIGS. 1 through 9 and in the process described with respect to FIGS. 11 through 15.

Figure 21:
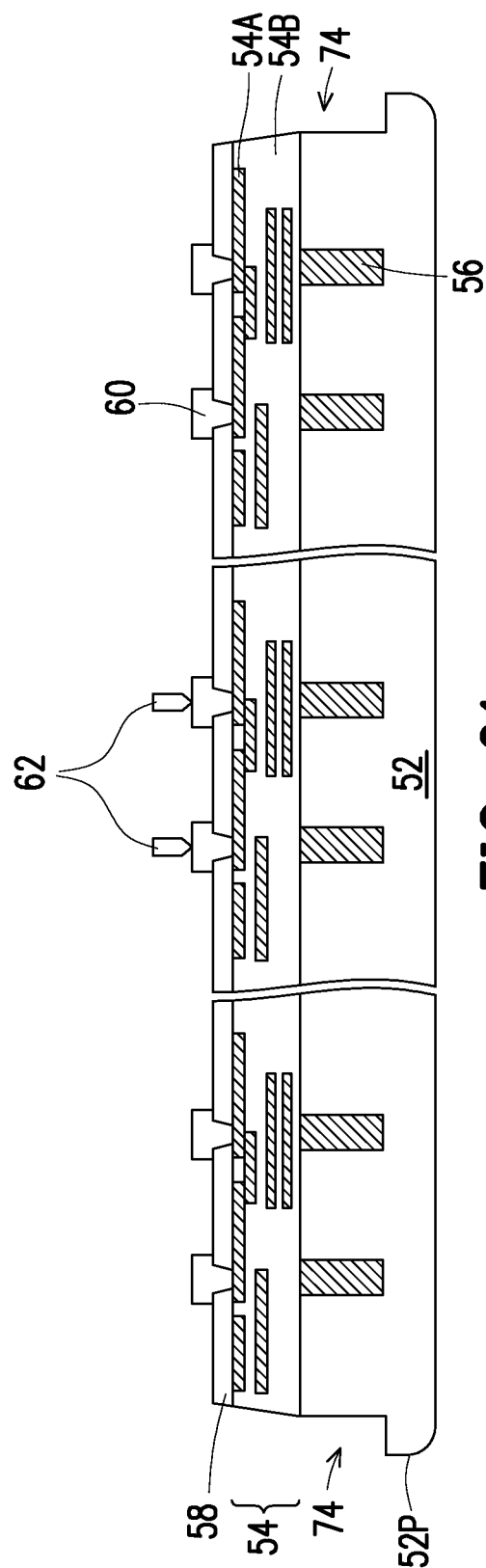
FIGS. 21 through 25 are cross-sectional views of intermediate steps during a process for wafer bonding, in accordance with some other embodiments.

In FIG. 21, a first wafer similar to that described with respect to FIG. 1 is formed or obtained. The first trim process 70 and the second trim process 80 are then performed to remove the edge regions of the semiconductor substrate 52. Notably, the first trim process 70 and the second trim process 80 are performed before the dielectric layer 64 (see FIG. 22) is formed. After trimming is complete, circuit probe (CP) testing can be performed with a probe 62, in a manner similar to that described with respect to FIG. 2. Testing after trimming can help avoid the further processing of wafers that may be damaged by the trimming.

Figure 22:
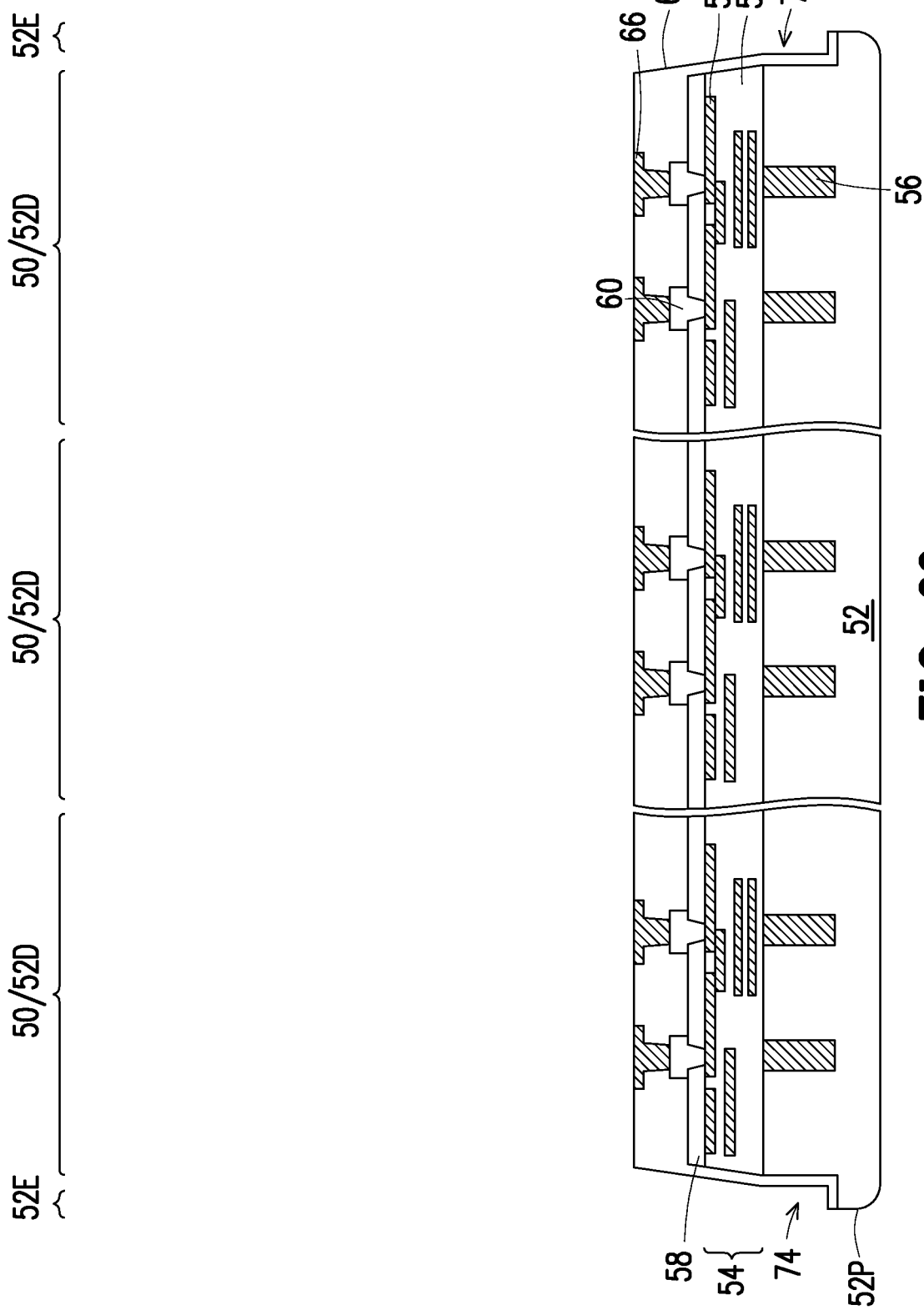

In FIG. 22, a dielectric layer 64 is formed at the front side of the wafer, e.g., on the contact pads 60 and the passivation layer(s) 58. Die connectors 66 are formed extending through the dielectric layer 64 and the passivation layer(s) 58 to physically and electrically couple the contact pads 60. The dielectric layer 64 and the die connectors 66 can formed in a manner similar to that described with respect to FIG. 3. In this embodiment, the die connectors 66 are connected to the contact pads 60 instead of the metallization patterns 54A of the interconnect structure 54. In another embodiment, the die connectors 66 are connected to metallization patterns of the interconnect structure 54.

Figure 23:
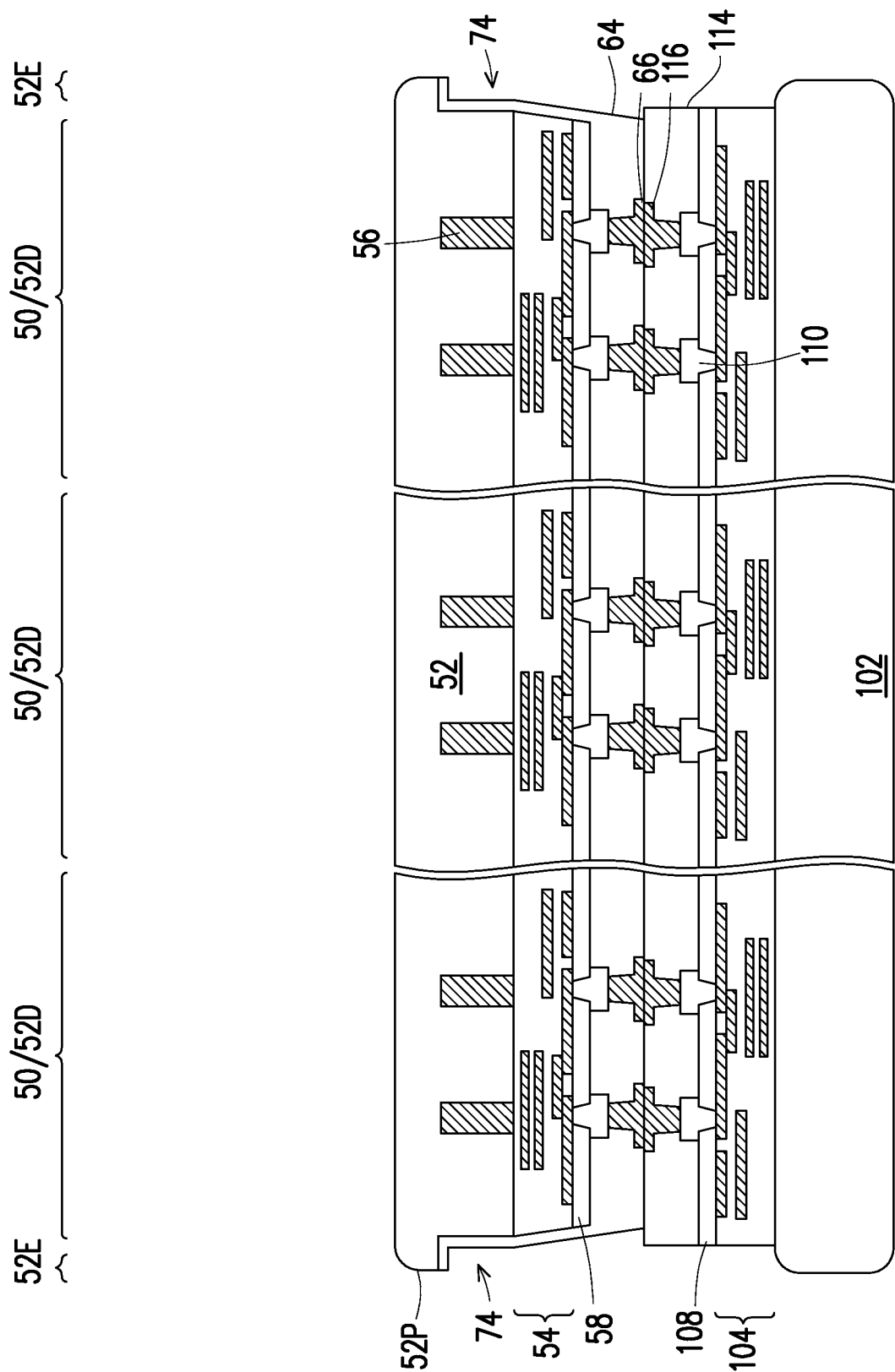

In FIG. 23, a second wafer similar to that described with respect to FIG. 7 is formed or obtained. In this embodiment, the die connectors 116 are connected to the contact pads 110 instead of the metallization patterns of the interconnect structure 104. In another embodiment, the die connectors 116 are connected to metallization patterns of the interconnect structure 104. The first wafer is then bonded to the second wafer. In the illustrated embodiment, the wafers are bonded in a face-to-face manner by hybrid bonding, such that the front side of the first wafer is bonded to the front side of the second wafer.

Figure 24:
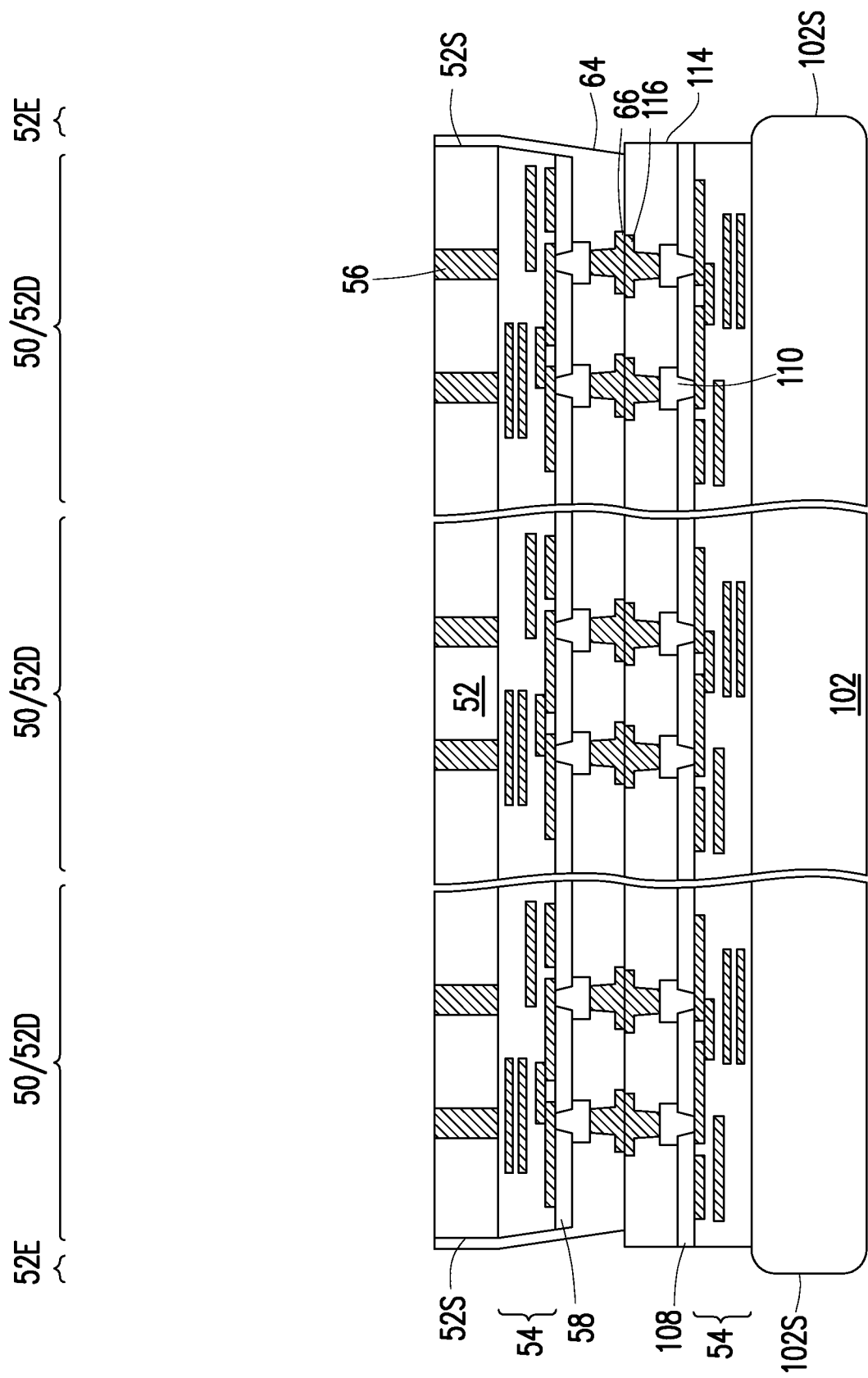

In FIG. 24, the semiconductor substrate 52 is thinned. The thinning may be by a similar process as that described with respect to FIG. 8. After the thinning, surfaces of the conductive vias 56 and the inactive surface of the semiconductor substrate 52 are coplanar (within process variations). As such, the conductive vias 56 are exposed at the back side of the first wafer. Because the dielectric layer 64 is formed before the first wafer is trimmed and thinned, the dielectric layer 64 extends along and contacts the sidewalls 52S of the semiconductor substrate 52. After the thinning, the sidewalls 52S, 102S of the semiconductor substrates 52, 102 are laterally offset from one another.

Figure 25:
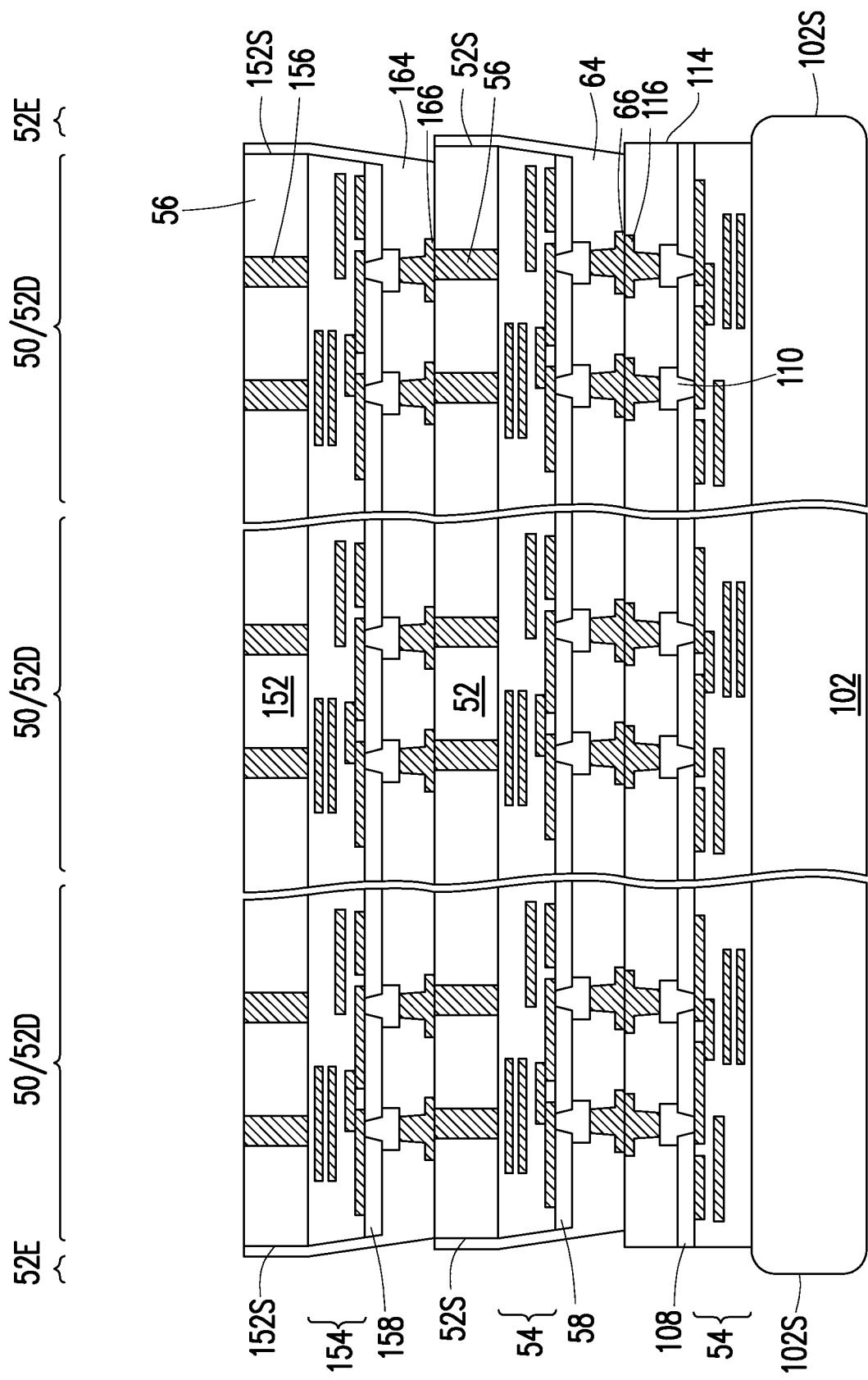

In FIG. 25, a third wafer similar to that described with respect to FIG. 9 is formed or obtained. The third wafer is then bonded to the first wafer. In the illustrated embodiment, the wafers are bonded in a back-to-face manner by hybrid bonding, such that the front side of the third wafer is bonded to the back side of the first wafer. The semiconductor substrate 152 is then thinned. After the thinning, the sidewalls of the semiconductor substrate 152 and the semiconductor substrate 52 are laterally offset from one another.

Embodiments may achieve advantages. Trimming dielectric features (such as the interconnect structure 54) at the edges of a wafer with a non-mechanical process, such as an etching process, allows fragile features such as extra low-K (ELK) dielectric layers to be trimmed at a reduced risk of damage compared to mechanical processes. Trimming semiconductor features (such as the semiconductor substrate 52) at the edges of a wafer with a mechanical process, such as sawing, allows rigid features to be trimmed more quickly so that wafer processing throughput may be improved. Alternatively, trimming semiconductor features (such as the semiconductor substrate 52) at the edges of a wafer with a non-mechanical process, such as an etching process, allows processing of the wafer to be simplified by avoiding the performance of a sawing step.

In an embodiment, a method includes: obtaining a first processed wafer including a first substrate and a first interconnect structure, the first substrate including a semiconductor material, the first interconnect structure including metal interconnects among dielectric material; removing an edge region of the first interconnect structure with a first trim process, the first trim process removing the dielectric material of the first interconnect structure at a faster rate than the semiconductor material of the first substrate; after the removing the edge region of the first interconnect structure, removing an edge region of the first substrate with a second trim process, the second trim process removing the semiconductor material of the first substrate at a faster rate than the dielectric material of the first interconnect structure; and bonding a second processed wafer to a front side of the first processed wafer.

In some embodiments of the method, the first trim process removes the edge region of the first interconnect structure along a first direction, and the second trim process removes the edge region of the first substrate along a second direction, the first direction and the second direction forming an obtuse angle, the second direction being perpendicular to an active surface of the first substrate. In some embodiments of the method, the first trim process is a first etching process. In some embodiments of the method, the first etching process is plasma etching performed with a fluorocarbon, a hydrofluorocarbon, or oxygen, the plasma etching performed using a plasma generation power in a range of 100 W to 5000 W, the plasma etching performed at a pressure in a range of 1 mTorr to 500 mTorr, the plasma etching performed for a duration in a range of 10 seconds to 600 seconds. In some embodiments of the method, the first etching process is laser etching performed with a wavelength in a range of 300 nm to 600 nm, the laser etching performed using a laser generation power in a range of 1 W to 30 W, the laser etching performed for a duration in a range of $10^{-15}$ seconds to $10^{-9}$ seconds. In some embodiments of the method, the second trim process is a mechanical process. In some embodiments of the method, the second trim process is a second etching process, the second etching process performed with different etching parameters than the first etching process. In some embodiments of the method, bonding the second processed wafer to the first processed wafer includes: depositing a first dielectric layer on the first processed wafer; forming first metal features in the first dielectric layer; depositing a second dielectric layer on the second processed wafer; forming second metal features in the second dielectric layer; forming dielectric-to-dielectric bonds between the first dielectric layer and the second dielectric layer; and forming metal-to-metal bonds between the first metal features and the second metal features. In some embodiments of the method, the removing the edge region of the first substrate is performed after the depositing the first dielectric layer on the first processed wafer. In some embodiments of the method, the removing the edge region of the first substrate is performed before the depositing the first dielectric layer on the first processed wafer. In some embodiments, the method further includes: obtaining a third processed wafer including a third substrate and a third interconnect structure; removing an edge region of the third interconnect structure with the first trim process; after the removing the edge region of the third interconnect structure, removing an edge region of the third substrate with the second trim process; and bonding the third processed wafer to a back side of the first processed wafer, a sidewall of the third substrate being laterally offset from a sidewall of the first substrate.

In an embodiment, a method includes: obtaining a first processed wafer including a substrate and a interconnect structure; etching the interconnect structure to remove the interconnect structure from an edge region of the first processed wafer; after etching the interconnect structure, sawing the substrate to remove a first portion of the substrate in the edge region of the first processed wafer; bonding the first processed wafer to a second processed wafer; and thinning the substrate to remove a second portion of the substrate in the edge region of the first processed wafer.

In some embodiments of the method, etching the interconnect structure includes etching the interconnect structure with a plasma etching process, the plasma etching process removing a dielectric material of the interconnect structure at a faster rate than a semiconductor material of the substrate, where the dielectric material of the interconnect structure is not removed during the sawing the substrate. In some embodiments of the method, etching the interconnect structure includes etching the interconnect structure with a laser etching process, the laser etching process removing a dielectric material of the interconnect structure at a faster rate than a semiconductor material of the substrate, where the dielectric material of the interconnect structure is not removed during the sawing the substrate.

In an embodiment, a device includes: a first wafer including a first substrate and a first interconnect structure, a sidewall of the first interconnect structure forming an obtuse angle with a sidewall of the first substrate; and a second wafer bonded to the first wafer, the second wafer including a second substrate and a second interconnect structure, the sidewall of the first substrate being laterally offset from a sidewall of the second substrate and a sidewall of the second interconnect structure.

In some embodiments, the device further includes: a dielectric layer bonding the second wafer to the first wafer, a sidewall of the dielectric layer forming the obtuse angle with the sidewall of the first substrate. In some embodiments, the device further includes: a dielectric layer bonding the second wafer to the first wafer, the dielectric layer extending along the sidewall of the first interconnect structure and the sidewall of the first substrate. In some embodiments of the device, the sidewall of the first substrate has a first portion and a second portion, the first portion connecting the second portion to an active surface of the first substrate, the first portion forming the obtuse angle with the second portion. In some embodiments of the device, the sidewall of the first substrate forms a right angle with an active surface of the first substrate. In some embodiments of the device, the sidewall of the first substrate forms an acute angle with an active surface of the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   obtaining a first processed wafer comprising a first substrate and a first interconnect structure, the first substrate comprising a semiconductor material, the first interconnect structure comprising metal interconnects among dielectric material;
   removing an edge region of the first interconnect structure with a first trim process, the first trim process removing the dielectric material of the first interconnect structure at a faster rate than the semiconductor material of the first substrate;
   after the removing the edge region of the first interconnect structure, removing an edge region of the first substrate with a second trim process, the second trim process removing the semiconductor material of the first substrate at a faster rate than the dielectric material of the first interconnect structure; and
   bonding a second processed wafer to a front side of the first processed wafer.

2. The method of claim 1, wherein the first trim process removes the edge region of the first interconnect structure along a first direction, and the second trim process removes the edge region of the first substrate along a second direction, the first direction and the second direction forming an obtuse angle, the second direction being perpendicular to an active surface of the first substrate.

3. The method of claim 1, wherein the first trim process is a first etching process.

4. The method of claim 3, wherein the first etching process is plasma etching performed with a fluorocarbon, a hydrofluorocarbon, or oxygen, the plasma etching performed using a plasma generation power in a range of 100 W to 5000 W, the plasma etching performed at a pressure in a range of 1 mTorr to 500 mTorr, the plasma etching performed for a duration in a range of 10 seconds to 600 seconds.

5. The method of claim 3, wherein the first etching process is laser etching performed with a wavelength in a range of 300 nm to 600 nm, the laser etching performed using a laser generation power in a range of 1 W to 30 W, the laser etching performed for a duration in a range of $10^{-15}$ seconds to $10^{-9}$ seconds.

6. The method of claim 3, wherein the second trim process is a mechanical process.

7. The method of claim 3, wherein the second trim process is a second etching process, the second etching process performed with different etching parameters than the first etching process.

8. The method of claim 1, wherein bonding the second processed wafer to the first processed wafer comprises:
   depositing a first dielectric layer on the first processed wafer;
   forming first metal features in the first dielectric layer;
   depositing a second dielectric layer on the second processed wafer;
   forming second metal features in the second dielectric layer;
   forming dielectric-to-dielectric bonds between the first dielectric layer and the second dielectric layer; and
   forming metal-to-metal bonds between the first metal features and the second metal features.

9. The method of claim 8, wherein the removing the edge region of the first substrate is performed after the depositing the first dielectric layer on the first processed wafer.

10. The method of claim 8, wherein the removing the edge region of the first substrate is performed before the depositing the first dielectric layer on the first processed wafer.

11. The method of claim 1 further comprising:
    obtaining a third processed wafer comprising a third substrate and a third interconnect structure;
    removing an edge region of the third interconnect structure with the first trim process;
    after the removing the edge region of the third interconnect structure, removing an edge region of the third substrate with the second trim process; and
    bonding the third processed wafer to a back side of the first processed wafer, a sidewall of the third substrate being laterally offset from a sidewall of the first substrate.

12. A method comprising:
    obtaining a first processed wafer comprising a substrate and a interconnect structure;
    etching the interconnect structure to remove the interconnect structure from an edge region of the first processed wafer;
    after etching the interconnect structure, sawing the substrate to remove a first portion of the substrate in the edge region of the first processed wafer;
    bonding the first processed wafer to a second processed wafer; and
    thinning the substrate to remove a second portion of the substrate in the edge region of the first processed wafer.

13. The method of claim 12, wherein etching the interconnect structure comprises etching the interconnect structure with a plasma etching process, the plasma etching process removing a dielectric material of the interconnect structure at a faster rate than a semiconductor material of the substrate, and wherein the dielectric material of the interconnect structure is not removed during the sawing the substrate.

14. The method of claim 12, wherein etching the interconnect structure comprises etching the interconnect structure with a laser etching process, the laser etching process removing a dielectric material of the interconnect structure at a faster rate than a semiconductor material of the substrate, and wherein the dielectric material of the interconnect structure is not removed during the sawing the substrate.

15. A device comprising:
    a first wafer comprising a first substrate and a first interconnect structure, a sidewall of the first interconnect structure forming an obtuse angle with a sidewall of the first substrate; and
    a second wafer bonded to the first wafer, the second wafer comprising a second substrate and a second interconnect structure, the sidewall of the first substrate being laterally offset from a sidewall of the second substrate and a sidewall of the second interconnect structure.

16. The device of claim 15 further comprising:
    a dielectric layer bonding the second wafer to the first wafer, a sidewall of the dielectric layer forming the obtuse angle with the sidewall of the first substrate.

17. The device of claim 15 further comprising:
    a dielectric layer bonding the second wafer to the first wafer, the dielectric layer extending along the sidewall of the first interconnect structure and the sidewall of the first substrate.

18. The device of claim 15, wherein the sidewall of the first substrate has a first portion and a second portion, the first portion connecting the second portion to an active surface of the first substrate, the first portion forming the obtuse angle with the second portion.

19. The device of claim 15, wherein the sidewall of the first substrate forms a right angle with an active surface of the first substrate.

20. The device of claim 15, wherein the sidewall of the first substrate forms an acute angle with an active surface of the first substrate.

* * * * *